United States Patent
Noh et al.

(10) Patent No.: US 9,472,659 B2
(45) Date of Patent: Oct. 18, 2016

(54) SEMICONDUCTOR DEVICES

(71) Applicants: Jin-Hyun Noh, Seoul (KR); Su-Tae Kim, Suwon-si (KR); Jae-Hyun Yoo, Suwon-si (KR); Byeong-Ryeol Lee, Yongin-si (KR); Jong-Sung Jeon, Hwaseong-si (KR)

(72) Inventors: Jin-Hyun Noh, Seoul (KR); Su-Tae Kim, Suwon-si (KR); Jae-Hyun Yoo, Suwon-si (KR); Byeong-Ryeol Lee, Yongin-si (KR); Jong-Sung Jeon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/813,848

(22) Filed: Jul. 30, 2015

(65) Prior Publication Data

US 2016/0141413 A1 May 19, 2016

(30) Foreign Application Priority Data

Nov. 19, 2014 (KR) .................. 10-2014-0161945

(51) Int. Cl.
*H01L 29/78* (2006.01)
*H01L 29/161* (2006.01)
*H01L 27/088* (2006.01)
*H01L 21/00* (2006.01)

(52) U.S. Cl.
CPC ....... *H01L 29/7816* (2013.01); *H01L 27/0886* (2013.01); *H01L 29/161* (2013.01); *H01L 29/785* (2013.01)

(58) Field of Classification Search
None
See application file for complete search history.

(56) References Cited

U.S. PATENT DOCUMENTS

| 5,264,719 A * | 11/1993 | Beasom ............ H01L 29/063 257/335 |
|---|---|---|
| 6,087,232 A | 7/2000 | Kim et al. |
| 6,930,005 B2 | 8/2005 | Efland et al. |
| 6,995,428 B2 | 2/2006 | Huang et al. |
| 8,012,838 B2 | 9/2011 | Kim |
| 8,067,289 B2 | 11/2011 | Park |
| 8,148,778 B2 | 4/2012 | Kobayashi et al. |
| 8,507,982 B2 | 8/2013 | Yamashina et al. |
| 8,536,648 B2 | 9/2013 | Shrivastava et al. |
| 8,592,274 B2 | 11/2013 | Tsuchiko |
| 8,710,587 B2 | 4/2014 | Moon et al. |
| 8,748,277 B2 | 6/2014 | Chen et al. |
| 2006/0006386 A1* | 1/2006 | Hirler ............ H01L 29/404 257/60 |
| 2009/0159970 A1* | 6/2009 | Ichijo ............ H01L 29/0634 257/343 |
| 2009/0166736 A1 | 7/2009 | Park |

(Continued)

FOREIGN PATENT DOCUMENTS

| JP | 2013175586 A | 9/2013 |
| JP | 2014107302 A | 6/2014 |

(Continued)

*Primary Examiner* — Evren Seven
(74) *Attorney, Agent, or Firm* — Harness, Dickey & Pierce, P.L.C.

(57) ABSTRACT

Semiconductor devices include a channel layer on a substrate, the channel layer including a material having a lattice constant different from a lattice constant of the substrate, a first gate electrode on the channel layer, a first source region of a first conductivity type at a first side of the first gate electrode, a first body region of a second conductivity type under the first source region and contacting the first source region, a first drain region of the first conductivity type disposed at a second side of the first gate electrode, a first drift region of the first conductivity type under the first drain region and contacting the first drain region, and a first stud region in the channel layer and the first drift region. The first stud region has an impurity concentration higher than an impurity concentration of the first drift region.

20 Claims, 17 Drawing Sheets

(56) References Cited

U.S. PATENT DOCUMENTS

| | | | |
|---|---|---|---|
| 2009/0194785 A1* | 8/2009 | Lu | H01L 29/1095 257/139 |
| 2009/0273028 A1* | 11/2009 | Mallikarjunaswamy | H01L 21/26513 257/335 |
| 2010/0320535 A1* | 12/2010 | Schmidt | H01L 29/872 257/335 |
| 2011/0115019 A1* | 5/2011 | Giles | H01L 29/0653 257/341 |
| 2011/0215401 A1 | 9/2011 | Miyakoshi et al. | |
| 2015/0061008 A1* | 3/2015 | McGregor | H01L 27/0883 257/337 |
| 2016/0064487 A1* | 3/2016 | Park | H01L 29/1095 257/343 |
| 2016/0133702 A1* | 5/2016 | Yoo | H01L 29/1045 257/337 |

FOREIGN PATENT DOCUMENTS

| | | |
|---|---|---|
| KR | 0336562 A | 5/2002 |
| KR | 20100020688 A | 2/2010 |
| KR | 20100064644 A | 6/2010 |

* cited by examiner

SEMICONDUCTOR DEVICES

CROSS-REFERENCE TO RELATED APPLICATION

This application claims priority, and all the benefits accruing under 35 U.S.C. §119, from Korean Patent Application No. 10-2014-0161945 filed on Nov. 19, 2014 in the Korean Intellectual Property Office, the content of which in its entirety is herein incorporated by reference.

BACKGROUND

1. Field

Example embodiments of the present inventive concepts relate to semiconductor devices.

2. Description of the Related Art

Compared to a bipolar transistor, a typical power MOS field effect transistor (MOSFET) has advantages including higher power gain and a simpler gate drive circuit. In addition, when the power MOSFET is turned off, there is no time delay caused by accumulation or recombination of minority carriers. Therefore, the power MOSFET is widely used during control, logic, and power switch functions.

An example of the power MOSFET is a double diffused MOSFET (DMOS) using double diffusion technology, such as a lateral DMOS (LDMOS) or a drain extended MOSFET.

SUMMARY

Example embodiments of the present inventive concepts relate to semiconductor devices.

Example embodiments of the present inventive concepts provide semiconductor devices having a low threshold voltage and/or a reduced on-resistance $R_{on}$.

Example embodiments of the present inventive concepts also provide semiconductor devices having a reduced on-resistance $R_{on}$ while maintaining breakdown voltage (BV) characteristics.

According to example embodiments of the present inventive concepts, there is provided a semiconductor device including a channel layer on a substrate, the channel layer including a material having a lattice constant different from a lattice constant the substrate, a first gate electrode on the channel layer, a first source region of a first conductivity type at a first side of the first gate electrode, a first drain region of the first conductivity type at a second side of the first gate electrode. The substrate includes a first body region of a second conductivity type under the first source region, the first body region contacting a bottom surface and at least one sidewall of the first source region, and a first drift region of the first conductivity type under the first drain region, the first drift region contacting a bottom surface and at least one sidewall of the first drain region. The semiconductor device further includes a first stud region in the channel layer and the first drift region, the first stud region having an impurity concentration higher than an impurity concentration of the first drift region.

In example embodiments of the present inventive concepts, a depth of the first stud region is smaller than a depth extending from a top surface of the channel layer to a bottom surface of the first drift region.

In example embodiments of the present inventive concepts, the first stud region and the first drain region are spaced apart from each other and do not overlap with each other.

In example embodiments of the present inventive concepts, the semiconductor device may further include an isolation region in the first drift region. The isolation region overlaps with a portion of the first gate electrode.

In example embodiments of the present inventive concepts, a depth of the first stud region is smaller than a depth of the isolation region.

In example embodiments of the present inventive concepts, the first gate electrode may include an opening, and the first stud region may be in the channel layer and the first drift region so as to correspond to the opening.

In example embodiments of the present inventive concepts, the first gate electrode may extend around a periphery of the opening.

In example embodiments of the present inventive concepts, the first gate electrode may cover the first stud region.

In example embodiments of the present inventive concepts, the substrate includes a first region and a second region, the channel layer and the first gate electrode are in the first region, and the semiconductor device further includes a second gate electrode in the second region on the substrate, a second source region of the second conductivity type at a first side of the second gate electrode, a second body region of the first conductivity type under the second source region, the second body region contacting a bottom surface and at least one sidewall of the second source region, a second drain region of the second conductivity type at a second side of the second gate electrode, and a second drift region of the second conductivity type under the second drain region, the second drift region contacting a bottom surface and at least one sidewall of the second drain region.

In example embodiments of the present inventive concepts, a semiconductor layer having a lattice constant different from a lattice constant the substrate may not included between the substrate and the second gate electrode.

In example embodiments of the present inventive concepts, the semiconductor device may further include a second stud region in the second drift region, the second stud region having an impurity concentration higher than an impurity concentration of the second drift region.

In example embodiments of the present inventive concepts, the first stud region has the first conductivity type.

In example embodiments of the present inventive concepts, the impurity concentration of the first stud region, an impurity concentration of the first source region and an impurity concentration of the first drain region, are substantially equal.

In example embodiments of the present inventive concepts, the first stud region has the second conductivity type.

In example embodiments of the present inventive concepts, the first stud region is electrically floating.

In example embodiments of the present inventive concepts, the substrate includes silicon, and the channel layer includes silicon germanium.

In example embodiments of the present inventive concepts, the substrate includes at least one fin type active pattern, and the first gate electrode extends across the at least one fin type active pattern.

According to example embodiments of the present inventive concepts, there is provided a semiconductor device including a gate electrode on a substrate, the gate electrode including an opening and a first gate line and a second gate line at opposing sides of the opening, a source region of a first conductivity type at a first side of the gate electrode and not overlapping with the opening, and a drain region of the first conductivity type at a second side of the gate electrode and not overlapping with the opening. The substrate includes a body region of a second conductivity type under the source region, the body region contacting a bottom surface and at least one sidewall of the source region, and a drift region of the first conductivity type under the drain region, the drift region contacting a bottom surface and at least one sidewall of the drain region. The semiconductor device further includes an isolation region in the drift region and overlapping with a portion of the second gate line, and a stud region in the substrate so as to correspond to the opening, the stud region having an impurity concentration higher than an impurity concentration of the body region and an impurity concentration of the drift region.

In example embodiments of the present inventive concepts, the stud region is in the drift region.

In example embodiments of the present inventive concepts, the stud region is spaced apart from the isolation region and does not overlap with the isolation region.

In example embodiments of the present inventive concepts, a depth of the stud region is smaller than a depth of the isolation region.

In example embodiments of the present inventive concepts, the semiconductor device may further include a channel layer between the substrate and the gate electrode. The channel layer includes a material having a lattice constant different from a lattice constant of the substrate.

In example embodiments of the present inventive concepts, the stud region extends through the channel layer and up to the drift region.

In example embodiments of the present inventive concepts, the source region is at a first side of the first gate line, and the opening is at a second side of the first gate line.

In example embodiments of the present inventive concepts, the drain region is at a first side of the second gate line, and the opening is at a second side of the second gate line.

In example embodiments of the present inventive concepts, the substrate includes at least one fin type active pattern, the first gate line and the second gate line extend across the at least one fin type active pattern, and the isolation region is in the at least one fin type active pattern.

According to example embodiments of the present inventive concepts, there is provided a semiconductor device including at least one fin type active pattern on a substrate, a field insulation layer on the substrate, the field insulation layer and surrounding portions of sidewalls of the at least one fin type active pattern, an isolation region in the at least one fin type active pattern, a gate electrode on the field insulation layer so as to extend across the at least one fin type active pattern, the gate electrode including a first gate line and a second gate line, a portion of the second gate line overlapping with the isolation region, the isolation region not being between the first gate line and the second gate line, a source and drain region of a first conductivity type respectively at a first side and a second side of the gate electrode. The substrate includes a body region of a second conductivity type under the source region, the body region contacting a bottom surface and at least one sidewall of the source region, and a drift region of the first conductivity type under the drain region, the drift region contacting a bottom surface and at least one sidewall of the drain region and the isolation region. The semiconductor device further includes a stud region in the drift region between the first gate line and the second gate line, the stud region having an impurity concentration than higher than an impurity concentration of the drift region.

In example embodiments of the present inventive concepts, the at least one fin type active pattern extends in a first direction, and in a cross-sectional view taken along the first direction, the source region recessed within the body region, and the drain region and the isolation region are recessed within the drift region.

In example embodiments of the present inventive concepts, the semiconductor device may further include a channel layer on a top surface of the at least one fin type active pattern, the channel layer including a material having a lattice constant different from a lattice constant of the at least one fin type active pattern.

In example embodiments of the present inventive concepts, a height of the isolation region is greater than or equal to a height of the at least one fin type active pattern protruding from a top surface of the field insulation layer.

In example embodiments of the present inventive concepts, the height of the isolation region is substantially equal to the height of the at least one fin type active pattern.

In example embodiments of the present inventive concepts, a depth of the stud region is smaller than a depth of the isolation region.

In example embodiments of the present inventive concepts, the source region, the drain region and the stud region further include an epitaxial layer, and the epitaxial layer is on a top surface and sidewalls of the at least one fin type active pattern, respectively.

In example embodiments of the present inventive concepts, the semiconductor device may further include a first recess, a second recess and a third recess in the at least one fin type active pattern. The source region includes a first epitaxial layer filling the first recess, the drain region includes a second epitaxial layer filling the second recess, and the stud region includes a third epitaxial layer filling the third recess.

According to example embodiments of the present inventive concepts, there is provided a semiconductor device including an isolation region in a substrate, a first active region and a second active region in a first direction with the isolation region interposed therebetween, a first gate line extending in a second direction different from the first direction, the first gate extending across the first active region, a second gate line electrically connected to the first gate line, the second gate line extending in the second direction so as to be parallel with the first gate line and across the first active region, and the second gate line having a portion overlapping with the isolation region, a source region of a first conductivity type in the first active region at a first side of the first gate line, and a drain region of the first conductivity type in the second active region. The substrate includes a body region of a second conductivity type under the source region, the body region contacting a bottom surface and at least one sidewall of the source region, and a drift region of the first conductivity type under the drain region. The drift region contacts a bottom surface and at least one sidewall of the drain region. The drift region has a portion overlapping with the isolation region and the first active region. The semiconductor device includes a stud region in the drift region of the first active region between the first gate line and the second gate line, the stud region having an impurity concentration higher than an impurity concentration of the drift region.

In example embodiments of the present inventive concepts, the semiconductor device may further include a gate connection line connecting one end of the first gate line and one end of the second gate line facing each other.

In example embodiments of the present inventive concepts, the semiconductor device may further include a plurality of gate connection lines connecting the first gate line and the second gate line.

In example embodiments of the present inventive concepts, the first gate line, the second gate line and the plurality of gate connection lines are connected to one another so as to define an opening, and the stud region is in the first active region under the opening.

In example embodiments of the present inventive concepts, the semiconductor device may further include a channel layer on a top surface of the first active region, the channel layer including a material having a lattice constant different from a lattice constant of the substrate.

In example embodiments of the present inventive concepts, the stud region extends through the channel layer and up to the drift region.

In example embodiments of the present inventive concepts, the semiconductor may further include a third active region and a fourth active region arranged in the first direction with the isolation region interposed therebetween. The first active region and the third active region are arranged in the second direction and the second active region and the fourth active region are arranged in the second direction, and the first gate line and the second gate line extend up to the third active region and the fourth active region, respectively.

In example embodiments of the present inventive concepts, the semiconductor device may further include a gate connection line connecting the first gate line and the second gate line between the first active region and the third active region.

According to example embodiments, there is provided a semiconductor device including a substrate having a body region and a drift region. The substrate includes a source region within the body region, and a drain region within the drift region, wherein the source region, the drain region and the drift region have a conductivity type different than a conductivity type of the drift region. The semiconductor device further includes a stud region in the drift region and between the source and drain regions, the stud region having an impurity concentration higher than an impurity concentration in the drift region, and a gate electrode extending over portions of the drift region adjacent to a periphery of the stud region. The semiconductor device further includes at least one of a channel layer including a material having a lattice constant different than a lattice constant of the substrate, and an isolation region in the drift region, the isolation region being between the drain region and the stud region.

In example embodiments, the stud region may be exposed through an opening in the gate electrode.

In example embodiments, the impurity concentration of the stud region is substantially equal to an impurity concentration of the source region and an impurity concentration of the drain region, or an impurity concentration of the body region.

In example embodiments, the gate electrode may be over the stud region.

In example embodiments, the substrate may have a first recess, a second recess and a third recess each separated from each other. The source region, the drain region and the stud region may be within the first, second and third recesses, respectively, and upper surfaces of the source region, the drain region and the stud region protrude from the substrate.

BRIEF DESCRIPTION OF THE DRAWINGS

Example embodiments will be more clearly understood from the following detailed description taken in conjunction with the accompanying drawings.

FIG. 1 is a conceptual plan view of a semiconductor device according to example embodiments of the present inventive concepts;

FIG. 2 is a cross-sectional view taken along the line A-A of FIG. 1;

FIG. 3 is a view illustrating a semiconductor device according to example embodiments of the present inventive concepts;

FIG. 4 is a view illustrating a semiconductor device according to example embodiments of the present inventive concepts;

FIG. 5 is a view illustrating a semiconductor device according to example embodiments of the present inventive concepts;

FIG. 6 is a view illustrating a semiconductor device according to example embodiments of the present inventive concepts;

FIG. 7 is a conceptual plan view illustrating example embodiments of the present inventive concepts;

FIG. 8 is a perspective view illustrating a semiconductor device according to example embodiments of the present inventive concepts;

FIG. 9 is a cross-sectional view taken along the line B-B of FIG. 8;

FIG. 10 is a cross-sectional view taken along the line C-C of FIG. 8;

FIGS. 11 and 12 are views illustrating a semiconductor device according to example embodiments of the present inventive concepts;

FIGS. 13 and 14 are views illustrating a semiconductor device according to example embodiments of the present inventive concepts;

FIG. 15 is a view illustrating a semiconductor device according to example embodiments of the present inventive concepts;

FIG. 16 is a view illustrating a semiconductor device according to example embodiments of the present inventive concepts;

FIG. 17 is a view illustrating a semiconductor device according to example embodiments of the present inventive concepts;

FIG. 18 is a view illustrating a semiconductor device according to example embodiments of the present inventive concepts;

FIG. 19 is a view illustrating a semiconductor device according to example embodiments of the present inventive concepts;

FIG. 20 is a conceptual plan view illustrating a semiconductor device according to example embodiments of the present inventive concepts;

FIG. 21 is a conceptual plan view illustrating a semiconductor device according to example embodiments of the present inventive concepts;

FIG. 22 is a conceptual plan view illustrating a semiconductor device according to example embodiments of the present inventive concepts;

FIG. 23 is a block diagram illustrating a semiconductor system according to example embodiments of the present inventive concepts;

FIG. 24 is a block diagram illustrating a semiconductor system according to example embodiments of the present inventive concepts; and FIGS. 25 and 26 are views illustrating other semiconductor systems to which semiconductor devices according to example embodiments of the present inventive concepts can be applied.

DETAILED DESCRIPTION OF EXAMPLE EMBODIMENTS

Figure 1:
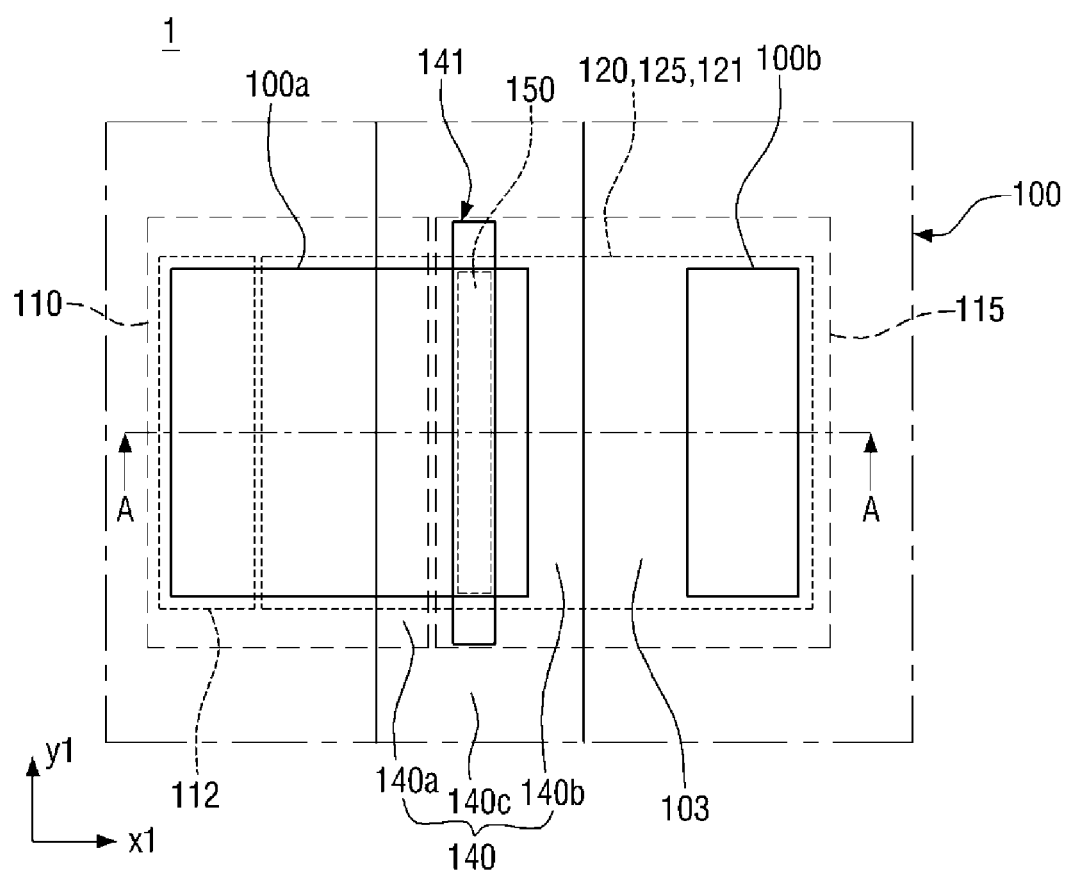
FIGS. 1-26 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Hereinafter, example embodiments of the present inventive concepts will be described with regard to a semiconductor device having a P-type source/drain region. However, it is obvious to those of ordinary skill in the art that the technical spirit of the present inventive concepts can also be applied to the semiconductor device having an N-type source/drain region. For example, the present inventive concepts can also be applied to a semiconductor device having an N-type source/drain region by changing the N-type into the P-type and vice versa.

Example embodiments of the present inventive concepts relate to semiconductor devices.

Hereinafter, a semiconductor device according to some example embodiments of the present inventive concepts will be described with reference to FIGS. 1 and 2.

Figure 2:
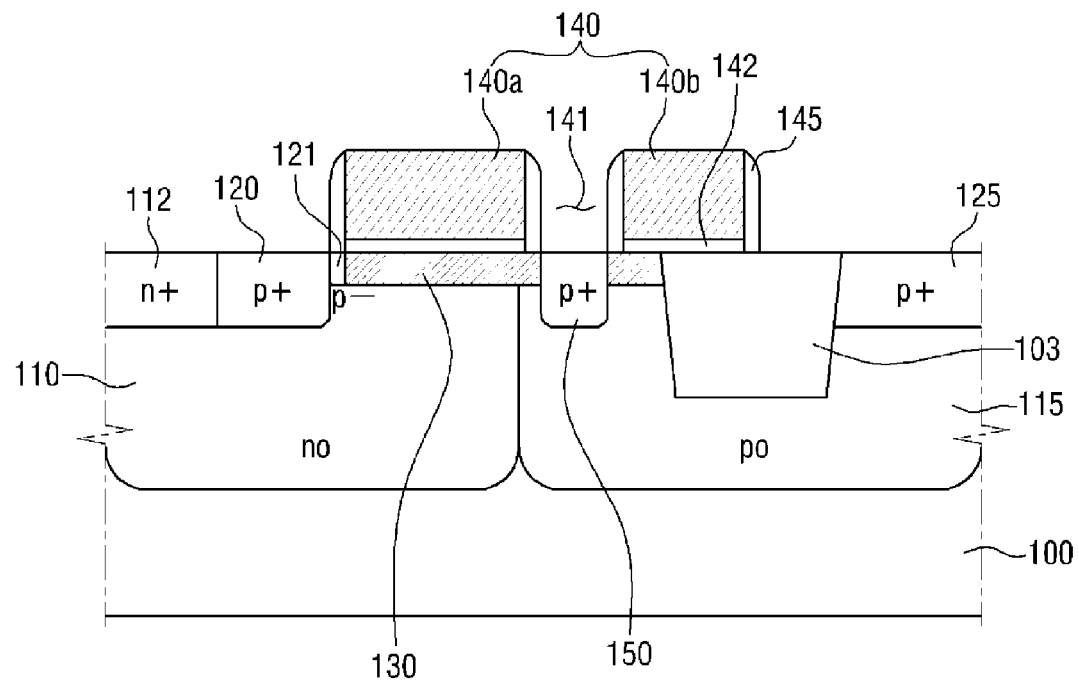

FIG. 1 is a conceptual plan view of a semiconductor device according to example embodiments of the present inventive concepts, and FIG. 2 is a cross-sectional view taken along the line A-A of FIG. 1.

Referring to FIGS. 1 and 2, a semiconductor device 1 according to example embodiments of the present inventive concepts may include a first channel layer 130, a first gate electrode 140, a first source region 120, a first body region 110, a first drain region 125, a first drift region 115, a first isolation region 103 and a first stud region 150.

The substrate 100 may include a first active region 100a and a second active region 100b. In addition, the first active region 100a and the second active region 100b may be isolated from each other by the first isolation region 103 formed in the substrate 100. In other words, the first active region 100a and the second active region 100b may be defined by the first isolation region 103.

The first isolation region 103 may be formed to isolate the first source region 120 and the first drain region 125 from each other, which will later be described. The first isolation region 103 may allow the first gate electrode 140 and the first drain region 125 to be spaced apart from and to be isolated from each other.

When a high voltage is applied to the first drain region 125, the first isolation region 103 may prevent reliability of the semiconductor device from deteriorating due to a high electric field formed between the first drain region 125 and an edge of the first gate electrode 140 adjacent to the first drain region 125. The first isolation region 103 may improve a break-down voltage of the semiconductor device.

The first isolation region 103 may include, for example, shallow trench isolation (STI) region, but is not limited thereto. The first isolation region 103 may include a local oxidation of silicon (LOCOS) region.

The first active region 100a and the second active region 100b may be disposed in a first direction X1 with the first isolation region 103 interposed therebetween.

The substrate 100 may include a base substrate and an epitaxial layer grown on the base substrate, but is not limited thereto. The substrate 100 may include only a base substrate without an epitaxial layer. The substrate 100 may be a silicon substrate, a gallium arsenide substrate, a silicon germanium, a ceramic substrate, a quartz substrate or a glass substrate for display. Alternatively, the substrate 100 may be a silicon on insulator (SOI) substrate. In the following description, example embodiments will be described with regard to a silicon substrate by way of example. In addition, the substrate 100 may be of a first conductivity type (e.g., p-type).

The first channel layer 130 may be formed on the substrate 100. The first channel layer 130 may be formed on the first body region 110 and the first drift region 115.

In the illustrated example embodiments, the first channel layer 130 is disposed on a portion of the first active region 100a of the substrate 100, but example embodiments are not limited thereto.

For example, once the first channel layer 130 is entirely formed throughout the first active region 100a and the second active region 100b, it may remain only on a portion of the first active region 100a in subsequent processes (for example, a portion of the first active region 100a overlapping with the first gate electrode 140 or portions of the first active region 100a overlapping with the first gate electrode 140 and the first stud region 150) while disappearing from the other portions of the first active region 100a.

Alternatively, once the first channel layer 130 may be entirely formed throughout the first active region 100a and the second active region 100b, it may remain on the first source region 120 and the first drain region 125 in subsequent processes.

The first channel layer 130 may be brought into contact with top portions of sidewalls of the first isolation region 103 separating the first active region 100a and the second active region 100b from each other.

The first channel layer 130 may include a material having a different lattice constant from the substrate 100. For example, the first channel layer 130 may include a material having a higher electron and/or hole mobility than the substrate 100. The first channel layer 130 may include, for example, silicon germanium, but example embodiments are not limited thereto.

In FIG. 2, a top surface of the first channel layer 130 and a top surface of the substrate 100 having the first source region 120 and the first drain region 125 are coplanar, which is illustrated only for ease of description, but example embodiments are not limited thereto.

The first gate electrode 140 may be formed on the substrate 100. In more detail, the first gate electrode 140 may be formed on the first channel layer 130. The first channel layer 130 may be disposed between the substrate 100 and the first gate electrode 140.

The first gate electrode 140 may include a first gate line 140a and a second gate line 140b extending in a second direction Y1, respectively. The first gate line 140a and the second gate line 140b may be arranged in parallel with each other.

The first gate electrode 140 may include a plurality of first connection gates 140c connecting the first gate line 140a and the second gate line 140b. Because the first connection gates 140c connect the first gate line 140a and the second gate line 140b, the first gate line 140a and the second gate line 140b are electrically connected.

The first gate electrode 140 may include a first opening 141 surrounded by the first gate line 140a, the second gate line 140b and the plurality of first connection gates 140c. That is to say, the first opening 141 may be defined by the first gate line 140a, the second gate line 140b and the plurality of first connection gates 140c. The first gate electrode 140 may be shaped to continuously surround the outer circumference of the first opening 141. The first gate electrode 140 may be formed along, or around, a periphery of the first opening 141.

The first gate line 140a may be formed to cross the first active region 100a. The first active region 100a may be positioned at opposite sides of the first gate line 140a in the first direction X1.

The second gate line 140b may be formed to cross the first active region 100a. A portion of the second gate line 140b may overlap with the first isolation region 103. That is to say, the first active region 100a may be positioned at one side of the second gate line 140b in the first direction X1, and the first isolation region 103 may be positioned at the other side of the second gate line 140b in the first direction X1.

A portion of the first gate electrode 140 may overlap with the first isolation region 103 disposed between the first active region 100a and the second active region 100b. The portion of the first gate electrode 140, that is, the portion of the second gate line 140b, may overlap with the first isolation region 103, so that the first gate electrode 140 may function as a field plate. Accordingly, concentration of electric fields around the first isolation region 103 is reduced, thereby improving the reliability of the semiconductor device.

The first gate electrode 140 may include, for example, at least one of polycrystalline silicon (poly Si), amorphous silicon (a-Si), titanium (Ti), titanium nitride (TiN), tantalum nitride (TaN), titanium carbide (TiC), tantalum carbide (TaC), aluminum (Al) and tungsten (W). When the first gate electrode 140 includes silicon (Si), the first gate electrode 140 may include a metal silicide.

A first gate insulation layer 142 may be formed under the first gate electrode 140, that is, between the first gate electrode 140 and the first channel layer 130. The first gate insulation layer 142 may include silicon oxide, silicon oxynitride, silicon nitride and/or a high-k material having a higher dielectric constant than that of silicon nitride. The high-k material may include, for example, at least one selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

In FIG. 2, the first gate insulation layer 142 formed on the first channel layer 130 but not formed along sidewalls of the first gate spacer 145 is illustrated, but example embodiments are not limited thereto. The first gate insulation layer 142 may also be formed along the sidewalls of a first gate spacer 145, like a second gate insulation layer 242 shown in FIG. 9.

The first gate spacer 145 may be formed on the sidewalls of the first gate electrode 140. The first gate spacer 145 may be formed on inner sidewalls of the first gate electrode 140 as well as on outer sidewalls of the first gate electrode 140. The first opening 141 may be continuously surrounded by the first gate spacer 145 formed on the inner sidewalls of the first gate electrode 140.

The first gate spacer 145 may include, for example, silicon nitride (SiN), silicon oxynitride (SiON), silicon oxide (SiO$_2$), silicon carbon nitride (SiOCN) and combinations thereof, but example embodiments are not limited thereto.

The first source region 120 may be formed at one side of the first gate electrode 140. Specifically, the first source region 120 may be formed at one side of the first gate line 140a. Here, the one side of the first gate line 140a may means a side not facing the second gate line 140b.

That is to say, the first opening 141 may be positioned at the other side of the first gate line 140a. Therefore, the first source region 120 may not overlap with the first opening 141.

The first source region 120 may be disposed in the first active region 100a. In addition, the first source region 120 may be an elevated source region.

A silicide layer may be formed on the first source region 120 to reduce resistance between the first source region 120 and a contact for applying a source voltage to the first source region 120.

The first body region 110 may be formed at one side of the first gate electrode 140. In detail, the first body region 110 may be formed under the first source region 120 to surround the first source region 120.

The first body region 110 may be formed in the first active region 100a. The first body region 110 may not overlap with the first opening 141.

The first body region 110 may have a lower doping concentration than the first source region 120 and the first drain region 125. Here, the doping concentration may be a concentration of an impurity doped (implanted) into each region. The first body region 110 may be formed under the first channel layer 130.

A first body contact region 112 being adjacent to the first source region 120 may be formed in the first body region 110 of the first active region 100a. The first body contact region 112 may have a higher doping concentration than the first body region 110.

A first source extension region 121 may be disposed between the first source region 120 and the first channel layer 130. The first source extension region 121 may be formed in the first body region 110.

The first source extension region 121 may have a lower doping concentration than the first source region 120 and the first drain region 125. In addition, the first source extension region 121 may have a lower doping concentration than the first body region 110 and the first drift region 115.

The first drain region 125 may be formed at the other side of the first gate electrode 140. The first drain region 125 may be formed at one side of the second gate line 140b. Here, the one side of the second gate line 140b may mean the side not facing the first gate line 140a.

That is to say, the first opening 141 may be positioned at the other side of the second gate line 140b. Therefore, the first drain region 125 may not overlap with the first opening 141.

The first drain region 125 may be disposed in the second active region 100b. In addition, the first drain region 125 may be an elevated drain region.

A silicide layer may be formed on the first drain region 125 to reduce resistance between the first drain region 125 and as a contact for applying a drain voltage to the first drain region 125.

The first drift region 115 may be formed under the first drain region 125 to surround the first drain region 125. The first drift region 115 may pass through the first isolation region 103 and may extend up to a portion of the first active region 100a.

That is to say, the portion of the first drift region 115 may overlap with the first isolation region 103 between the first active region 100a and the second active region 100b and a portion of the first active region 100a.

The first drift region 115 may be formed to surround the first isolation region 103 as well as the first drain region 125. In other words, the first isolation region 103 may be disposed in the first drift region 115.

The first drift region 115 may have a lower doping concentration than the first source region 120 and the first drain region 125.

In FIG. 2, the first drift region 115 and the first body region 110 making contact with each other are illustrated, which is provided only for ease of description, but example embodiments are not limited thereto.

When the first drift region 115 and the first body region 110 make contact with each other, an extension line of a boundary between the first drift region 115 and the first body region 110 may meet the first gate line 140a. The first drift region 115 may overlap with the first opening 141 of the first gate electrode 140.

The first stud region 150 may be disposed in the substrate 100 located to correspond to the first opening 141. The first stud region 150 may be disposed in the first channel layer 130 and the first drift region 115 corresponding to the first opening 141.

The first stud region 150 may be disposed in the first drift region 115 of the first active region 100a between the first gate line 140a and the second gate line 140b, which is because the first opening 141 may overlap with the first drift region 115.

Because the portion of the second gate line 140b overlaps with the first isolation region 103, the first stud region 150 may be spaced apart from the first isolation region 103 and not overlapping with the first isolation region 103. In addition, the first drain region 125 and the first stud region 150 may be isolated from each other by the first isolation region 103.

The first stud region 150 may pass through the first channel layer 130 and may extend up to the first drift region 115. The first stud region 150 may be disposed in the first drift region 115. Therefore, a depth of the first stud region 150 may be smaller than a depth ranging from a top surface of the first channel layer 130 to a bottom surface of the first drift region 115.

In addition, the depth of the first stud region 150 may be smaller than that of the first isolation region 103.

The first stud region 150 may have a higher doping concentration than the first drift region 115 and the first body region 110.

The first stud region 150 may be a high-concentration impurity region and is electrically floating. That is to say, an electrical signal may be transmitted to the first stud region 150, or the first stud region 150 may not be electrically connected to a power supplying wire.

Although not shown in FIG. 2, the first stud region 150 may be electrically insulated from the wire by an interlayer insulation layer covering the first gate electrode 140.

In addition, a silicide layer may be formed on a top surface of the first stud region 150. In FIG. 2, the top surface of the first stud region 150 being in parallel with the top surface of the first channel layer 130 is illustrated, but example embodiments are not limited thereto. The top surface of the first stud region 150 may be elevated from the top surface of the first channel layer 130.

In the semiconductor device 1 according to example embodiments of the present inventive concepts, the first stud region 150 may be a P-type high-concentration impurity region, which is the same with the first source region 120 and the first drain region 125.

In addition, the first stud region 150 may be formed in the same manufacturing process with the process of manufacturing the first source region 120 and the first drain region 125. Accordingly, an impurity concentration of the first stud region 150 may be substantially equal to an impurity concentration of the first source region 120 and an impurity concentration of the first drain region 125.

Alternatively, the first stud region 150 may be formed by a different manufacturing process from the first source region 120 and the first drain region 125, and an impurity concentration of the first stud region 150 may be different from an impurity concentration of the first source region 120 and an impurity concentration of the first drain region 125.

Referring to FIG. 1, the P-type first drift region 115 may be formed by a doping mask formed through the second active region 100b and the first isolation region 103 and a portion of the first active region 100a. The N-type first body region 110 may be formed by a doping mask formed through the portion of the first active region 100a and may be adjacent to the first drift region 115.

In addition, the N-type first body contact region 112 may be formed by a doping mask formed in the first body region 110 through the portion of the first active region 100a. The P-type first source region 120 and the first drain region 125 may be formed by a doping mask formed through the first active region 100a and the second active region 100b.

A description will be given of the effect that first stud region 150 having higher concentration than the first drift region 115 is formed in the first drift region 115. For example, it is described that the substrate 100 is silicon, and the first channel layer is silicon germanium.

Electron or hole mobility of the first channel layer 130 including silicon germanium is higher than that of the substrate 100. In addition, because silicon germanium has a narrower energy band gap than silicon, strong inversion is established even with a low gate bias, thereby lowering a threshold voltage of the semiconductor device.

However, even with the effect of lowering the threshold voltage, in order to allow the electron or hole having passed through the first channel layer 130 to move to the first drain region 125, the electron or hole should exceed a band gap barrier between the first channel layer 130 (including, for example, silicon germanium) and the first drift region 115 (including, for example, silicon). That is to say, the on-resistance $R_{on}$ of the semiconductor device may be increased, while reducing the threshold voltage.

Therefore, the band gap barrier between the first channel layer 130 and the first drift region 115 may be lowered or removed by forming the high-concentration first stud region 150 passing through the first channel layer 130 and extending to the first drift region 115. Accordingly, a current path having low resistance may be created in the first channel layer 130 and the first drift region 115.

Therefore, the electron or hole having passed through the first channel layer 130 may pass through the first drift region 115 to then easily reach the first drain region 125. That is to say, the high-concentration first stud region 150 may reduce the on-resistance $R_{on}$ of the semiconductor device.

In addition, because the first stud region 150 is a high-concentration impurity region, it may also function as a field diffusion region. That is to say, the first stud region 150 distributes an electrical field concentrating around the first isolation region 103, thereby improving a breakdown voltage of the semiconductor device.

Figure 3:
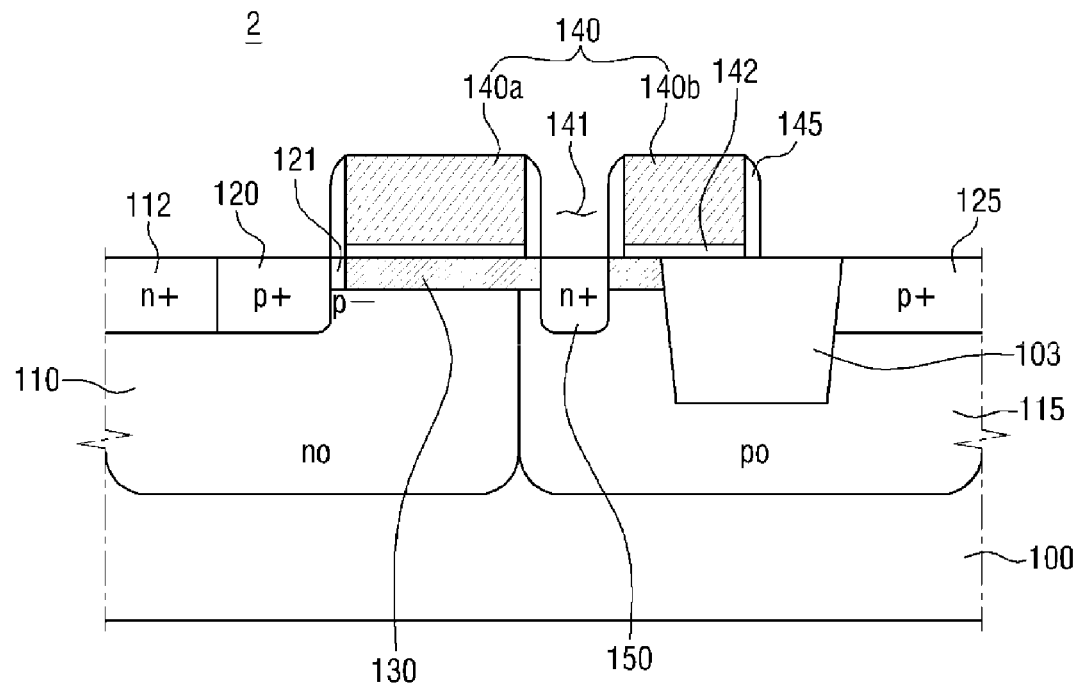

FIG. 3 is a view illustrating a semiconductor device according to example embodiments of the present inventive concepts.

For ease of description, the following description will focus on differences from the semiconductor device discussed above with reference to FIGS. 1 and 2.

Referring to FIG. 3, in a semiconductor device 2 according to example embodiments of the present inventive concepts, a first stud region 150 may be an N-type high-concentration impurity region different from a first source region 120 or a first drain region 125.

The first stud region 150 is an impurity region of a different type from the first drift region 115. However, the first stud region 150 may reduce resistance around a boundary between the first channel layer 130 and the first drift region 115.

Figure 4:
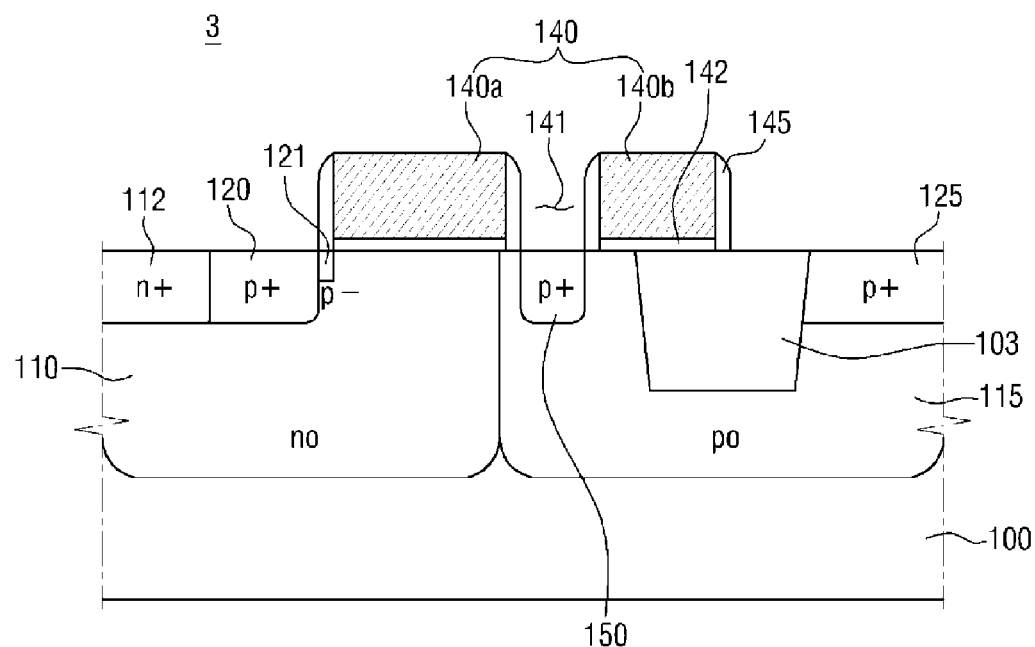

FIG. 4 is a view illustrating a semiconductor device according to example embodiments of the present inventive concepts.

For ease of description, the following description will focus on differences from the semiconductor device discussed above with reference to FIGS. 1 and 2.

Referring to FIG. 4, in a semiconductor device 3 according to example embodiments of the present inventive concepts, a first channel layer 130 may not be formed on a substrate 100.

In other words, a semiconductor layer including a material having a different lattice constant from the substrate 100 may not intervene between a first gate insulation layer 142 and the substrate 100. Therefore, in the semiconductor device 3 according to example embodiments of the present inventive concepts, a channel region may be a portion of the substrate 100.

The first stud region 150 is formed in the first drift region 115 of the first active region 100a. That is, the first stud region 150 does not pass through a semiconductor layer having a different lattice constant from the substrate 100, but is only formed in the substrate 100.

Because the high-concentration first stud region 150 formed in the first drift region 115 may create a low-resistance current path to move electron or hole, the first stud region 150 may reduce the on-resistance $R_{on}$ of the semiconductor device.

Figure 5:
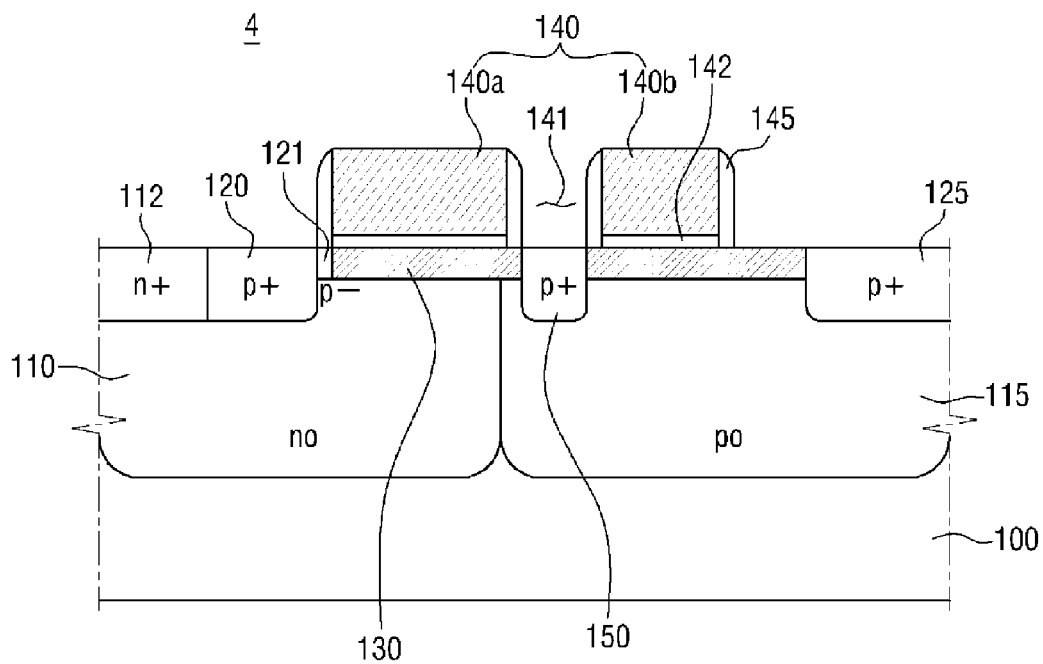

FIG. 5 is a view illustrating a semiconductor device according to example embodiments of the present inventive concepts.

For ease of description, the following description will focus on differences from the semiconductor device discussed above with reference to FIGS. 1 and 2.

Referring to FIG. 5, in a semiconductor device 4 according to example embodiments of the present inventive concepts, a first isolation region 103 may not be disposed between a first active region 100a and a second active region 100b.

In other words, the first active region 100a and the second active region 100b may be an integrated active region that is not divided by the first isolation region 103. A top surface of the first active region 100a and a top surface of the second active region 100b may be connected to each other.

A first source region 120 and a first drain region 125 may be formed in the same active region. A first channel layer 130 may be formed on the substrate 100 to extend up to the first drain region 125.

The first stud region 150 may pass through a central region of the first channel layer 130 to extend up to the first drift region 115.

In the semiconductor device 4 according to example embodiments of the present inventive concepts, an electron or hole may move between the first source region 120 and the first drain region 125 through the first channel layer 130. That is to say, because the first isolation region 103 is not disposed between the first source region 120 and the first drain region 125, it may not be necessary for the electron or hole to flow to the vicinity of the first isolation region 103.

Therefore, in the semiconductor device 4 according to example embodiments of the present inventive concepts, the first stud region 150 reduces or removes a band gap barrier between the first channel layer 130 and the first drift region 115, so that a current path having low resistance may not be created.

However, in the semiconductor device 4 according to example embodiments of the present inventive concepts, because the first stud region 150 has a higher doping concentration than the first drift region 115, the first stud region 150 may function as a field diffusion region relieving concentration of an electric field.

Figure 6:
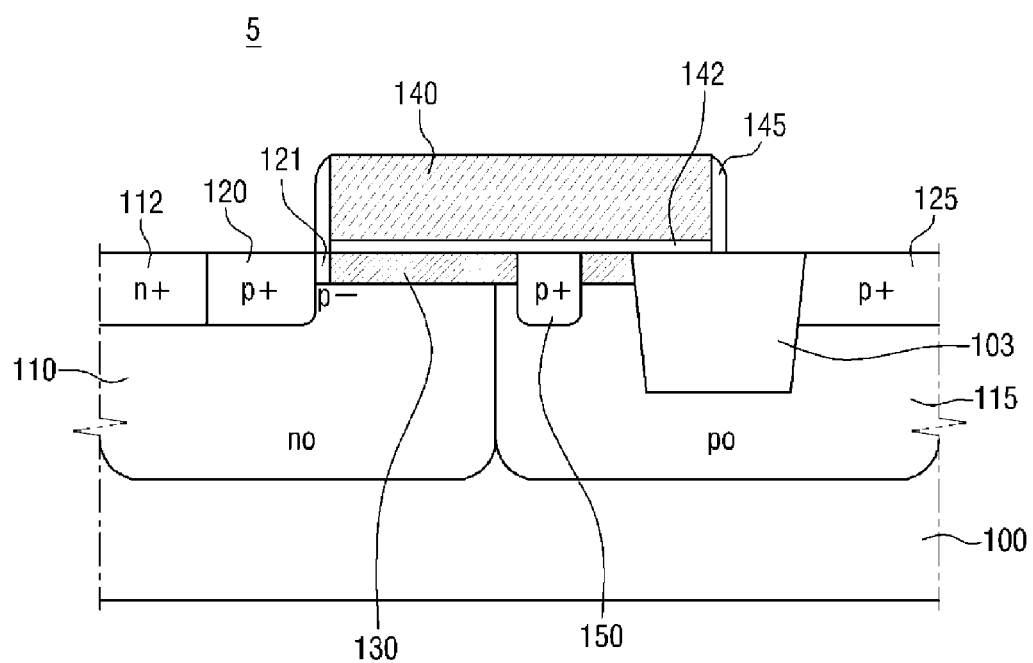

FIG. 6 is a view illustrating a semiconductor device according to example embodiments of the present inventive concepts.

For ease of description, the following description will focus on differences from the semiconductor device discussed above with reference to FIGS. 1 and 2.

Referring to FIG. 6, in a semiconductor device 5 according to example embodiments of the present inventive concepts, a first gate electrode 140 may not be separated into a first gate line 140a and a second gate line 140b. In other words, the first gate electrode 140 may not include a first opening 141.

Therefore, a first stud region 150 may be disposed under the first gate electrode 140 and may overlap with the first gate electrode 140.

In other words, the first gate electrode 140 may entirely cover the first stud region 150.

The first stud region 150 may be formed before forming the first gate electrode 140. In more detail, the first stud region 150 may pass through the first channel layer 130 to extend up to a first drift region 115. Thereafter, the first gate electrode 140 may be formed on the first gate electrode 140, and a first source region 120 and a first drain region 125 may then be formed.

Figure 7:
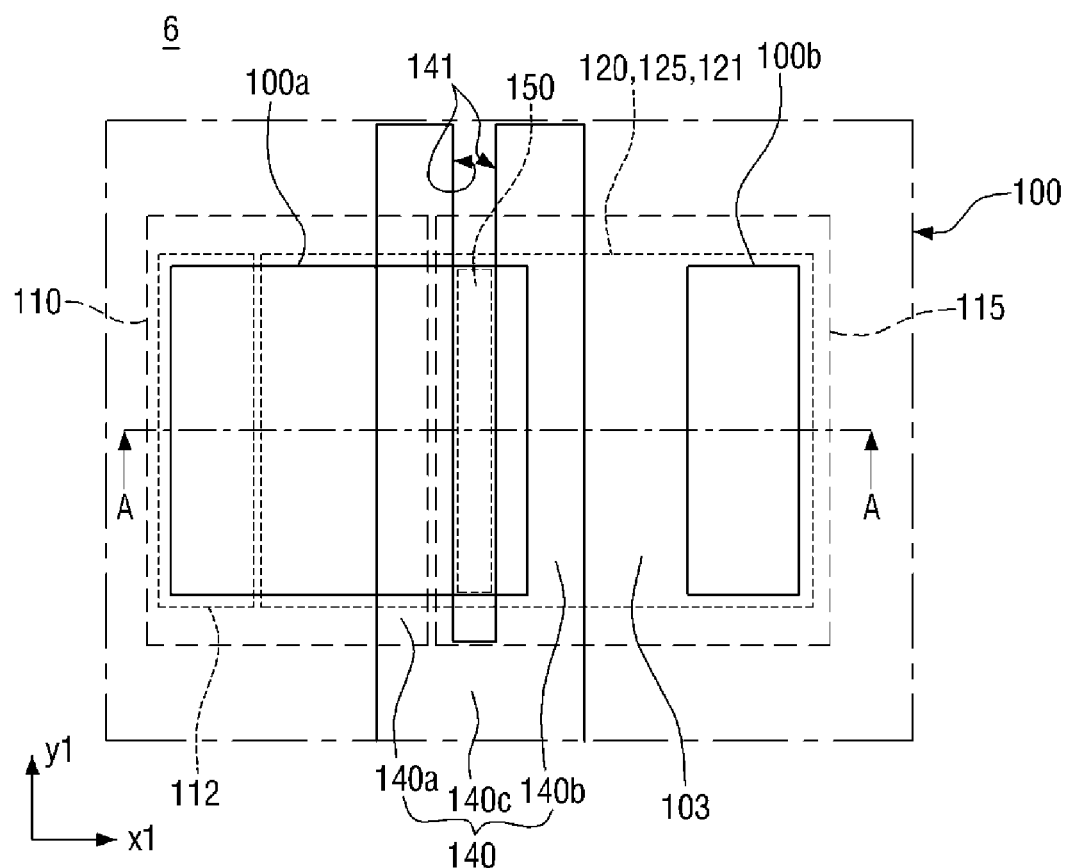

FIG. 7 is a conceptual plan view illustrating example embodiments of the present inventive concepts.

For ease of description, the following description will focus on differences from the semiconductor device discussed above with reference to FIGS. 1 and 2.

Referring to FIG. 7, in a semiconductor device 6 according to example embodiments of the present inventive concepts, one end of a first gate line 140a and one end of a second gate line 140b facing each other may be connected to each other by a first connection gate 140c.

However, the other end of the first gate line 140a and the other end of the second gate line 140b facing each other may not be connected to each other.

Therefore, the first gate electrode 140 may not continuously surround the outer circumference of a first opening 141. The first gate line 140a, the second gate line 140b and the first connection gate 140c may be connected to one another to have a 'U' shape, but example embodiments are not limited thereto.

Next, a semiconductor device according to example embodiments of the present inventive concepts will be described with reference to FIGS. 8 to 10.

Figure 8:
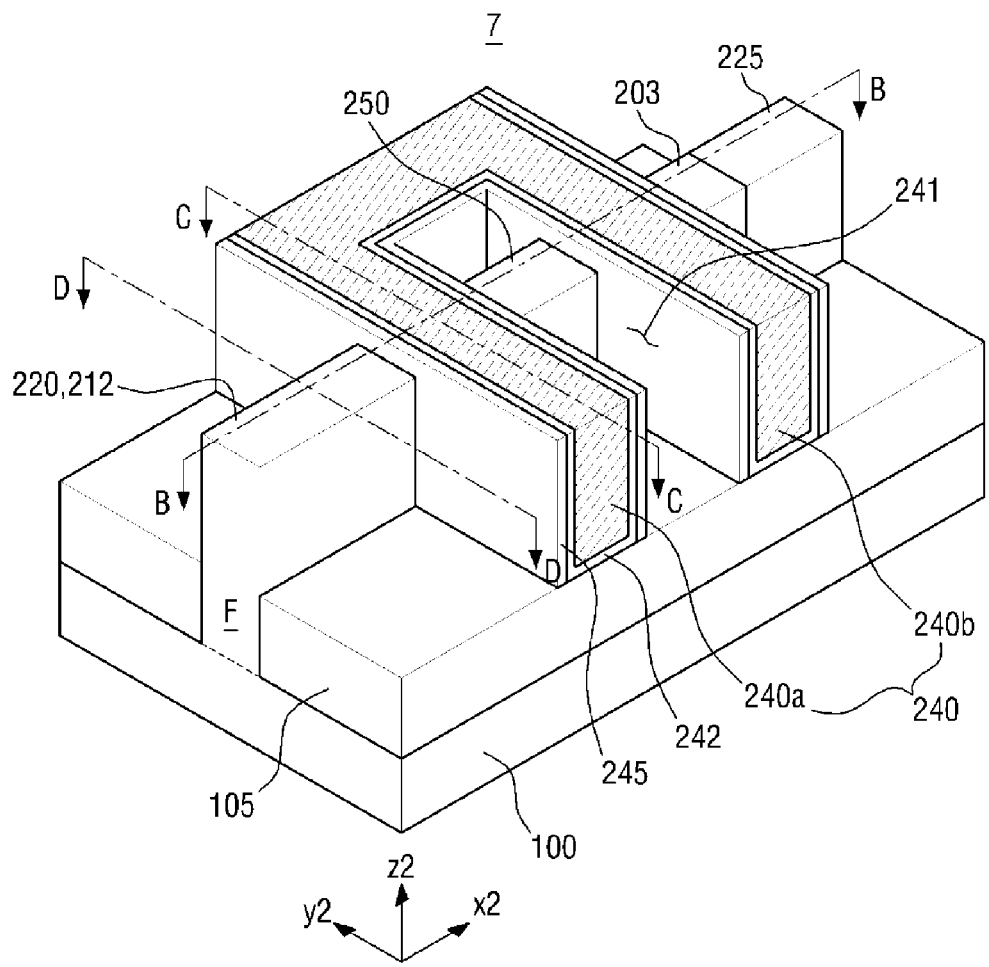
Figure 9:
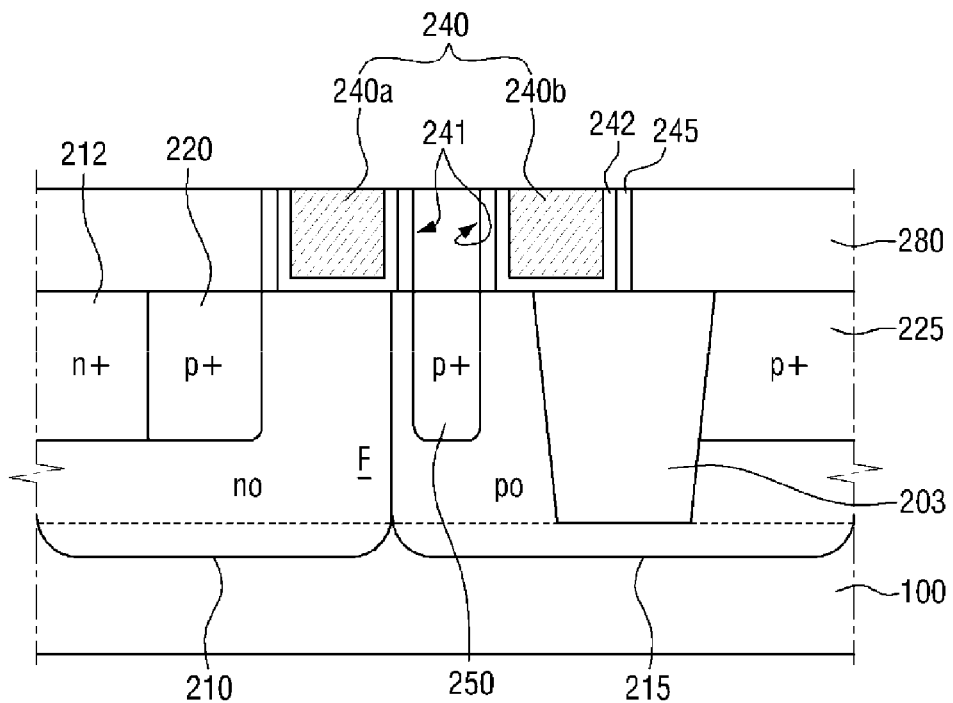
Figure 10:
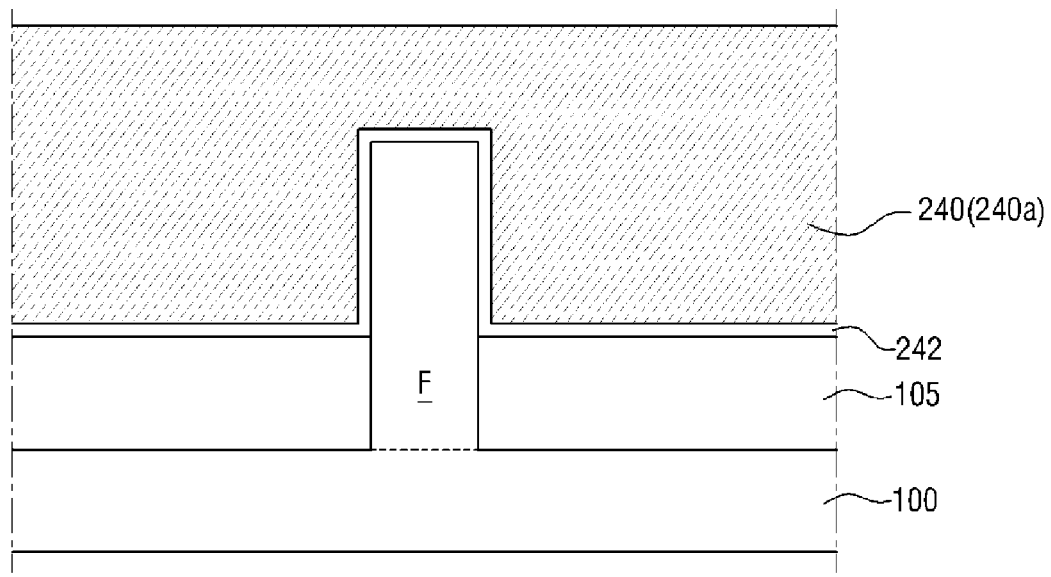

FIG. 8 is a perspective view illustrating a semiconductor device according to example embodiments of the present inventive concepts, FIG. 9 is a cross-sectional view taken along the line B-B of FIG. 8 and FIG. 10 is a cross-sectional view taken along the line C-C of FIG. 8.

For brevity, an interlayer insulation layer 280 is not illustrated in FIG. 8.

Referring to FIGS. 8 to 10, a semiconductor device 7 according to example embodiments of the present inventive concepts may include a fin type active pattern F, a second gate electrode 240, a second source region 220, a second body region 210, a second drain region 225, a second drift region 215, a second isolation region 203 and a second stud region 250.

The fin type active pattern F may be formed on the substrate 100. The fin type active pattern F may protrude from the substrate 100. Because a field insulation layer 105 covers portions of lateral surfaces of the fin type active pattern F, at least a portion of the fin type active pattern F may protrude above the field insulation layer 105.

The fin type active pattern F may be defined by the field insulation layer 105. The fin type active pattern F may extend lengthwise along a third direction X2. The field insulation layer 105 may include, for example, an oxide layer, a nitride layer, an oxynitride layer or a combination thereof, but example embodiments are not limited thereto.

The fin type active pattern F may be a portion of the substrate 100 and may include an epitaxial layer grown from the substrate 100. The fin type active pattern F may include, for example, an element semiconductor material, such as silicon or germanium. In addition, the fin type active pattern F may include a compound semiconductor, for example, a group IV-IV compound semiconductor or a group III-V compound semiconductor. In detail, the group IV-IV compound semiconductor may be, for example, a binary compound or a ternary compound including at least two elements of carbon (C), silicon (Si), germanium (Ge), and tin (Sn) or a compound doped with an IV group element.

The group III-V compound semiconductor may include, for example, a binary compound, a ternary compound or a quaternary compound, prepared by combining at least one group III element of aluminum (Al), gallium (Ga) and indium (In) with at least one group V element of phosphorus (P), arsenic (As) and antimony (Sb).

In the semiconductor device 7 according to example embodiments of the present inventive concepts, it is assumed that the fin type active pattern F includes silicon (Si).

The second isolation region 203 may be disposed in the fin type active pattern F. The second isolation region 203 may separate at least a portion of the fin type active pattern F into two parts.

A height of the second isolation region 203 may be equal to or greater than a height of the fin type active pattern F protruding above a top surface of the field insulation layer 105. In the semiconductor device 7 according to example embodiments of the present inventive concepts, the height of the second isolation region 203 may be equal to or greater than the height of the fin type active pattern F.

The second isolation region 203 may be formed to isolate the second source region 220 and the second drain region 225 from each other. The second isolation region 203 may allow the second gate electrode 240 and the second drain region 225 to be spaced apart from and to be isolated from each other. The second isolation region 203 may include, for example, shallow trench isolation (STI) region.

The second gate electrode 240 extends in a fourth direction Y2 and is disposed to cross the fin type active pattern F. The second gate electrode 240 may be disposed on the fin type active pattern F and the field insulation layer 105.

The second gate electrode 240 may include a third gate line 240a and a fourth gate line 240b extending in the fourth direction Y2. The third gate line 240a and the fourth gate line 240b may be disposed to be parallel with each other.

The second gate electrode 240 may include a connection part connecting the third gate line 240a and the fourth gate line 240b to each other. That is to say, the third gate line 240a and the fourth gate line 240b may be electrically connected to each other.

The second gate electrode 240 may include a second opening 241 formed between the third gate line 240a and the fourth gate line 240b.

In FIG. 8, one end of the third gate line 240a and one end of the fourth gate line 240b facing each other are connected to each other and the other end of the third gate line 240a and the other end of the fourth gate line 240b facing each other are not connected to each other, which is illustrated only for ease of description, but example embodiments are not limited thereto.

For example, as illustrated in FIG. 8, the second gate electrode 240 may not be shaped to continuously surround the outer circumference of the second opening 241 and may have a 'U' shape, for example. Alternatively, like the first gate electrode 140 shown in FIG. 1, the second gate electrode 240 may be shaped to continuously surround the outer circumference of the second opening 241.

A portion of the second gate electrode 240 formed to cross the fin type active pattern F may overlap with the second isolation region 203 formed in the fin type active pattern F.

For example, the third gate line 240a may be formed to cross the fin type active pattern F, and the fin type active pattern F may be positioned at opposite sides of the third gate line 240a in a third direction X2. That is to say, the third gate line 240a may not include a portion overlapping with the second isolation region 203.

The fourth gate line 240b may be formed to cross the fin type active pattern F. A portion of the fourth gate line 240b may be disposed to overlap with the second isolation region 203.

A second isolation region 203 may not be positioned between the third gate line 240a and the fourth gate line 240b. That is to say, the second opening 241 may not overlap with the second isolation region 203.

The second gate electrode 240 may include, for example, at least one of polycrystalline silicon (poly Si), amorphous silicon (a-Si), titanium (Ti), titanium nitride (TiN), tantalum nitride (TaN), titanium carbide (TiC), tantalum carbide (TaC), aluminum (Al) and tungsten (W). When the second gate electrode 240 includes silicon (Si), the second gate electrode 240 may include a metal silicide. The second gate electrode 240 may be formed by a replacement process, but example embodiments are not limited thereto.

A second gate spacer 245 may be disposed on sidewalls of the second gate electrode 240. The second gate spacer 245 may be formed along the outer circumference of the second opening 241.

The second gate insulation layer 242 may be disposed between the fin type active pattern F and the second gate electrode 240. The second gate insulation layer 242 may be formed along sidewalls and a top surface of the fin type active pattern F protruding above the field insulation layer 105. In addition, the second gate insulation layer 242 may be disposed between the second gate electrode 240 and the field insulation layer 105.

The second gate insulation layer 242 may be disposed between the second gate electrode 240 and the second gate spacer 245. The second gate insulation layer 242 may be formed along sidewalls of the second gate spacer 245.

The second gate insulation layer 242 may include silicon oxide, silicon oxynitride, silicon nitride and a high-k material having a higher dielectric constant than silicon nitride.

The second source region 220 and the second drain region 225 may be disposed at one side and the other side of the second gate electrode 240.

For example, the second source region 220 may be disposed at one side of the second gate electrode 240. The second source region 220 may be disposed at one side of the third gate line 240a. Here, the one side of the third gate line 240a may mean a side not facing the fourth gate line 240b.

That is to say, the second opening 241 may be positioned at the other side of the third gate line 240a. Therefore, the second source region 220 may not overlap with the second opening 241.

The second drain region 225 may be formed at the other side of the second gate electrode 240. The second drain region 225 may be formed at one side of the fourth gate line 240b. Here, the one side of the fourth gate line 240b may mean a side not facing the third gate line 240a.

That is to say, the second opening 241 may be positioned at the other side of the fourth gate line 240b. Therefore, the second drain region 225 may not overlap with the second opening 241.

Although not shown in FIG. 9, a silicide layer may be formed on top surfaces of the second source region 220 and the second drain region 225.

In the semiconductor device 7 according to example embodiments of the present inventive concepts, the second source region 220 and the second drain region 225 may be formed in the fin type active pattern F. The second source region 220 and the second drain region 225 may be impurity regions formed in the fin type active pattern F. A second isolation region 203 may be positioned between the second source region 220 and the second drain region 225.

In FIG. 9, a depth of the second source region 220 and a depth of the second drain region 225 are equal to a height of the fin type active pattern F protruding above the top surface of the field insulation layer 105, which is illustrated only for ease of description, but example embodiments are not limited thereto.

The second body region 210 may be formed at one side of the second gate electrode 240. The second body region 210 may be formed under the second source region 220 to surround the second source region 220. In more detail, on a cross-sectional view taken along the line in which the fin type active pattern F extends, the second body region 210 may be formed to surround the second source region 220.

The second body region 210 may be formed in the fin type active pattern F. In addition, a portion of the second body region 210 may be formed in the substrate 100. The second body region 210 may not overlap with the second opening 241.

The second body region 210 may have a lower doping concentration than the second source region 220 and the second drain region 225.

The second body contact region 212 being adjacent to the second source region 220 may be formed in the second body region 210 of the fin type active pattern F. The second body contact region 212 may have a higher doping concentration than the second body region 210.

Although not shown in FIG. 9, a second source extension region connected to the second source region 220 may be formed under the second gate electrode 240, that is, the third gate line 240a.

The second drift region 215 may be formed under the second drain region 225 to surround the second drain region 225. In more detail, on the cross-sectional view taken along the line in which the fin type active pattern F extends, the second drift region 215 may be formed to surround the second source region 220.

The second drift region 215 may be formed in the fin type active pattern F. In addition, a portion of the second drift region 215 may be formed in the substrate 100. The second drift region 215 may overlap with the second isolation region 203 and the second opening 241.

Therefore, the second drift region 215 may be formed to surround the second isolation region 203 as well as the second drain region 225. In other words, the second isolation region 203 may be disposed in the second drift region 215.

The second drift region 215 may have a lower doping concentration than the second source region 220 and the second drain region 225.

In FIG. 9, the second drift region 215 and the second body region 210 making contact with each other are illustrated, which is provided only for ease of description, but example embodiments are not limited thereto.

The second stud region 250 may be disposed in the fin type active pattern F located to correspond to the second opening 241. The second stud region 250 may be disposed in the second drift region 215 corresponding to the second opening 241.

The second stud region 250 may be disposed in the second drift region 215 of the fin type active pattern F between the third gate line 240a and the fourth gate line 240b.

Because a portion of the fourth gate line 240b overlaps with the second isolation region 203, the second stud region 250 may be spaced apart from the second isolation region 203 while not overlapping with the second isolation region 203.

Because the second stud region 250 is formed in the second drift region 215, a depth of the second stud region 250 may be smaller than a depth ranging from a top surface of the fin type active pattern F to a bottom surface of the second drift region 215.

In addition, the depth of the second stud region 250 may be smaller than the depth of the second isolation region 203.

The second stud region 250 may have a higher doping concentration than the second drift region 215 and the second body region 210.

The second stud region 250 may be not electrically connected to a wire providing an electrical signal or power, so that the second stud region 250 may be electrically floating.

In addition, a silicide layer may be formed on the second stud region 250.

In FIG. 9, the second stud region 250 is a P-type high-concentration impurity region, which is the same with the second source region 220 and the second drain region 225, but example embodiments are not limited thereto. As illustrated in FIG. 3, the second stud region 250 may also be an N-type high-concentration impurity region.

Figure 11:
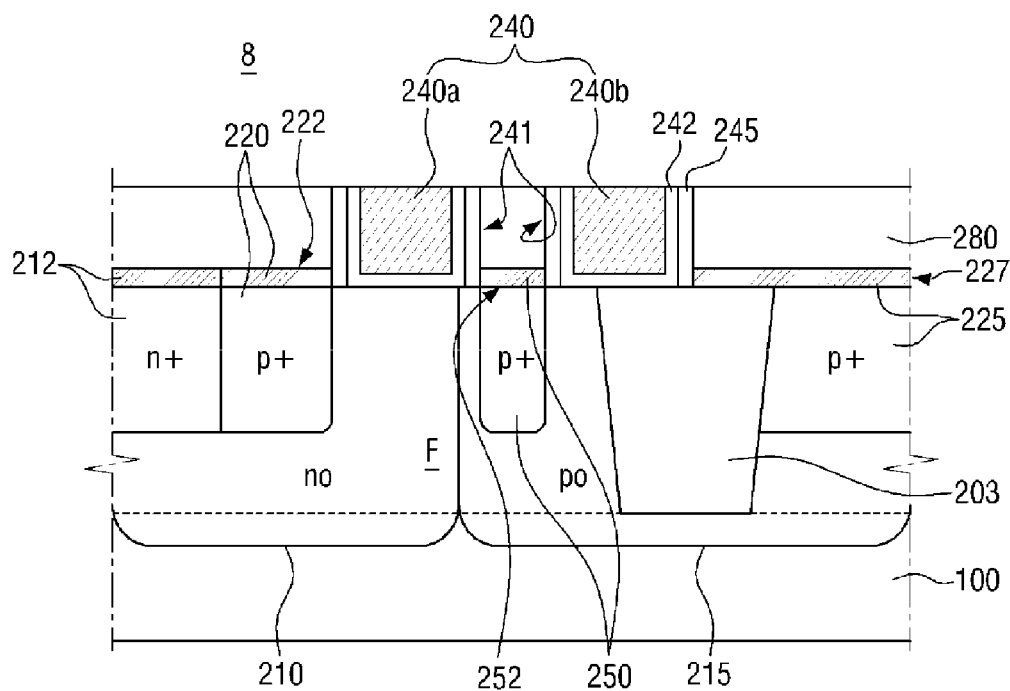
Figure 12:
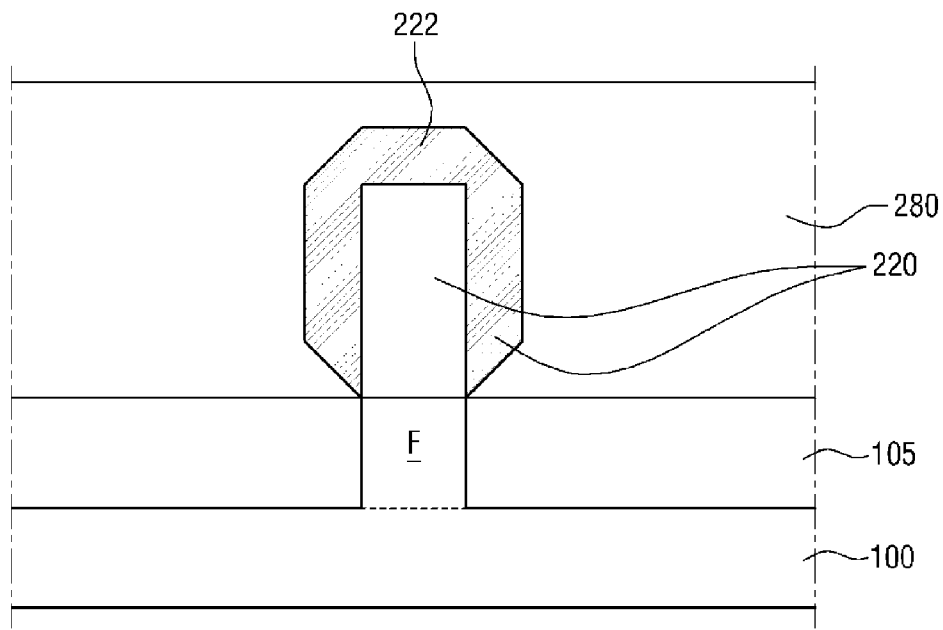

FIGS. 11 and 12 are views illustrating a semiconductor device according to example embodiments of the present inventive concepts.

For ease of description, the following description will focus on differences from the semiconductor device discussed above with reference to FIGS. 8 to 10.

Here, FIG. 11 is a cross-sectional view taken along the line B-B of FIG. 8 and FIG. 12 is a cross-sectional view taken along the line D-D of FIG. 8.

Referring to FIGS. 11 and 12, in a semiconductor device 8 according to example embodiments of the present inventive concepts, a second source region 220 may further include a first epitaxial layer 222 formed on a top surface and sidewalls of a fin type active pattern F.

In addition, a second drain region 225 may further include a second epitaxial layer 227 formed on the top surface and sidewalls of the fin type active pattern F, and a second stud region 250 may further include a third epitaxial layer 252 formed on the top surface and sidewalls of the fin type active pattern F.

The first epitaxial layer 222, the second epitaxial layer 227 and the third epitaxial layer 252 may be formed along the sidewalls and the top surface of the fin type active pattern F protruding above a top surface of a field insulation layer 105.

The second source region 220 may be an elevated source region, the second drain region 225 may be an elevated drain region and the second stud region 250 may be an elevated stud region.

When the fin type active pattern F is a silicon fin type active pattern, the first epitaxial layer 222, the second epitaxial layer 227 and the third epitaxial layer 252 may include, for example, one of a silicon epitaxial layer, a silicon germanium epitaxial layer and a carbon-containing silicon epitaxial layer, but example embodiments are not limited thereto.

Figure 13:
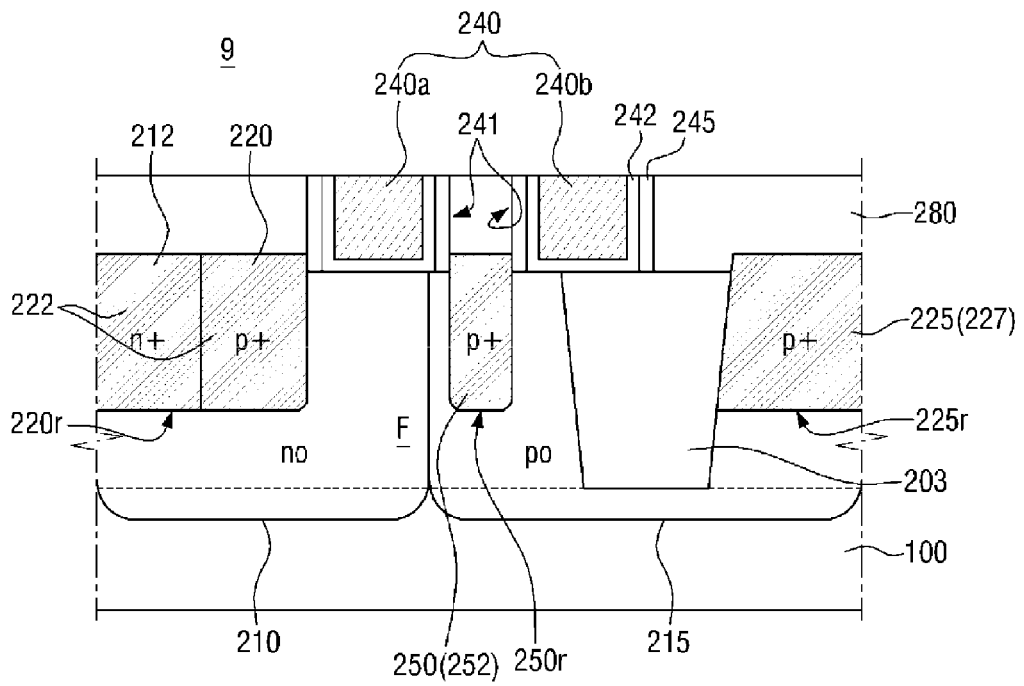
Figure 14:
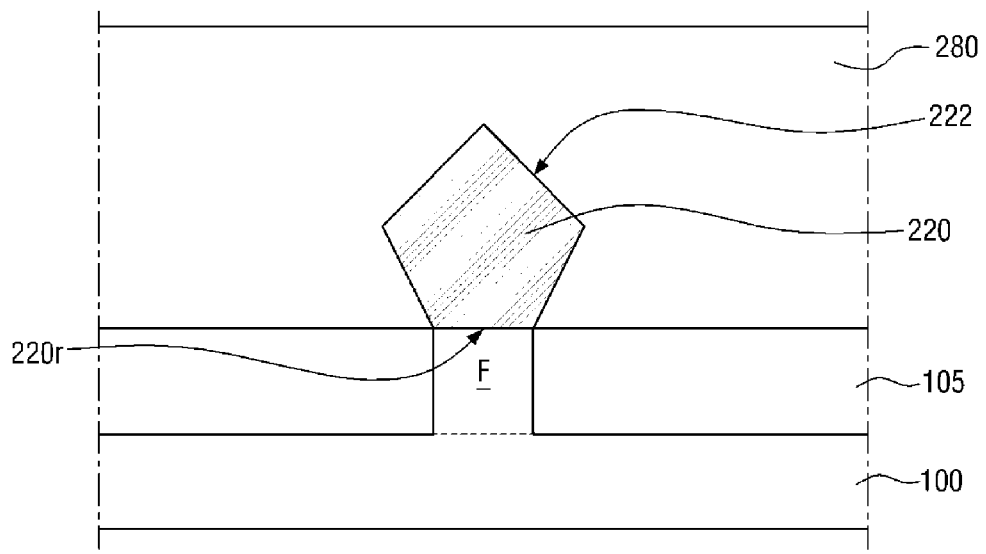

FIGS. 13 and 14 are views illustrating a semiconductor device according to example embodiments of the present inventive concepts.

For ease of description, the following description will focus on differences from the semiconductor device discussed above with reference to FIGS. 8 to 10.

Here, FIG. 13 is a cross-sectional view taken along the line B-B of FIG. 8 and FIG. 14 is a cross-sectional view taken along the line D-D of FIG. 8.

Referring to FIGS. 13 and 14, in a semiconductor device 9 according to example embodiments of the present inventive concepts, a first recess 220r may be formed in a fin type active pattern F at one side of a second gate electrode 240.

In addition, a second recess 225r may be formed in the fin type active pattern F at the other side of the second gate electrode 240, and a third recess 250r may be formed in the fin type active pattern F between a third gate line 240a and a fourth gate line 240b.

A first epitaxial layer 222 may be formed on the fin type active pattern F while filling the first recess 220r. A second epitaxial layer 227 may be formed on the fin type active pattern F while filling the second recess 250r. A third epitaxial layer 252 may be formed on the fin type active pattern F while filling the third recess 250r.

A second source region 220 may be an elevated source region, a second drain region 225 may be an elevated drain region and a second stud region 250 may be an elevated stud region.

The second source region 220 may include a portion of the first epitaxial layer 222. At least a portion of the remaining first epitaxial layer 222 may be a second body contact region 212. The second drain region 225 may include a second epitaxial layer 227 and the second stud region 250 may include a third epitaxial layer 252.

The first epitaxial layer 222 may have an outer circumferential surface having various shapes. For example, the outer circumferential surface of the first epitaxial layer 222 may have at least one shape of a diamond, a circle and a rectangle. In FIG. 14, a diamond shape (or a pentagonal or hexagonal shape) is illustrated by way of example, but example embodiments are not limited thereto.

Because the semiconductor devices according to example embodiments of the present inventive concepts are described with regard to P-type semiconductor devices, first to third epitaxial layers 222, 227 and 252 may include a compressive stress material. For example, the compressive stress material may be a material having a larger lattice constant than Si, e.g., SiGe. The compressive stress material may improve the mobility of carriers of a channel region by applying compressive stress to the fin type active pattern F.

When the semiconductor devices according to example embodiments of the present inventive concepts are described with regard to N-type semiconductor devices, first to third epitaxial layers 222, 227 and 252 may include a tensile stress material. For example, when the fin type active pattern F includes Si, the first to third epitaxial layers 222, 227 and 252 include a material having a smaller lattice constant than Si (e.g., SiC). The tensile stress material may improve the mobility of carriers of a channel region by applying tensile stress to the fin type active pattern F. Alternatively, the first to third epitaxial layers 222, 227 and 252 may include Si, like the fin type active pattern F.

If the third epitaxial layer 252 is formed in a different manufacturing process from the process of manufacturing the first epitaxial layer 222 and the second epitaxial layer 227, it may include a different material from the first epitaxial layer 222 and the second epitaxial layer 227.

Figure 15:
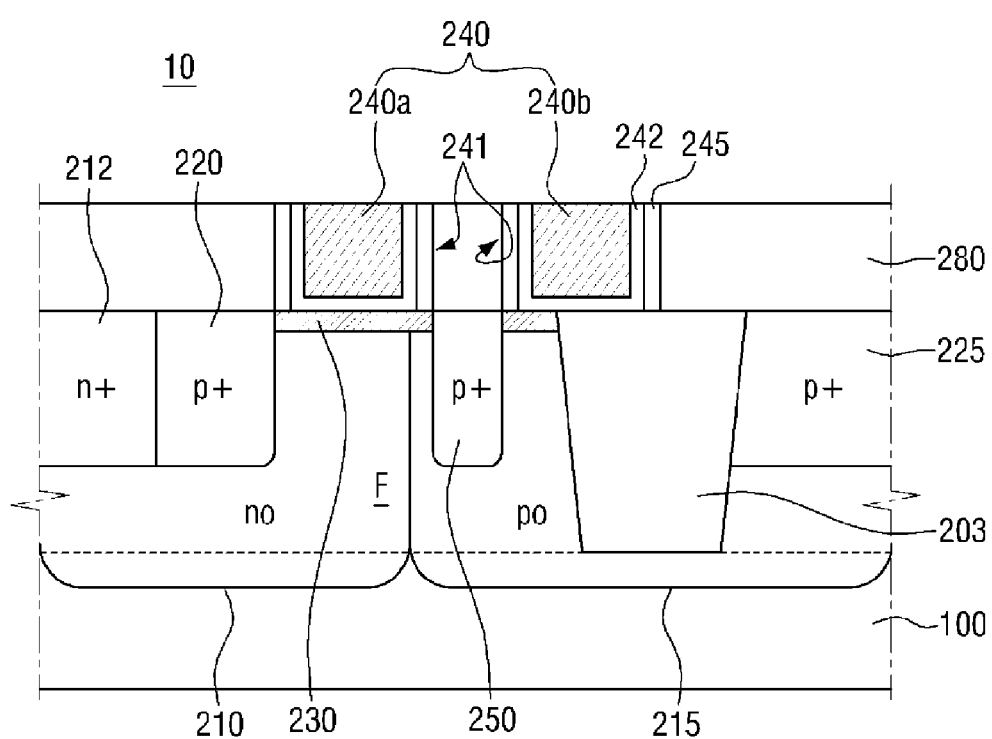

FIG. 15 is a view illustrating a semiconductor device according to example embodiments of the present inventive concepts.

For ease of description, the following description will focus on differences from the semiconductor device discussed above with reference to FIGS. 8 to 10.

Referring to FIG. 15, a semiconductor device 10 according to example embodiments of the present inventive concepts may further include a second channel layer 230 disposed on a top surface of a fin type active pattern F. The second channel layer 230 may be formed on a second body region 210 and a second drift region 215.

In addition, the second channel layer 230 may also be formed on at least portions of sidewalls of the fin type active pattern F.

The second channel layer 230 may include a material having a different lattice constant from the fin type active pattern F. For example, the second channel layer 230 may include a material having higher electron and/or hole mobility than the fin type active pattern F. The second channel layer 230 may include, for example, silicon germanium, but example embodiments are not limited thereto.

In FIG. 15, a top surface of the second channel layer 230 and a top surface of the fin type active pattern F having the second source region 220 and the second drain region 225 are coplanar, which is illustrated only for ease of description, but example embodiments are not limited thereto.

The second stud region 250 may be disposed in a second channel layer 230 and a second drift region 215 corresponding to the second opening 241. The second stud region 250 may pass through the second channel layer 230 to extend up to the second drift region 215.

Figure 16:
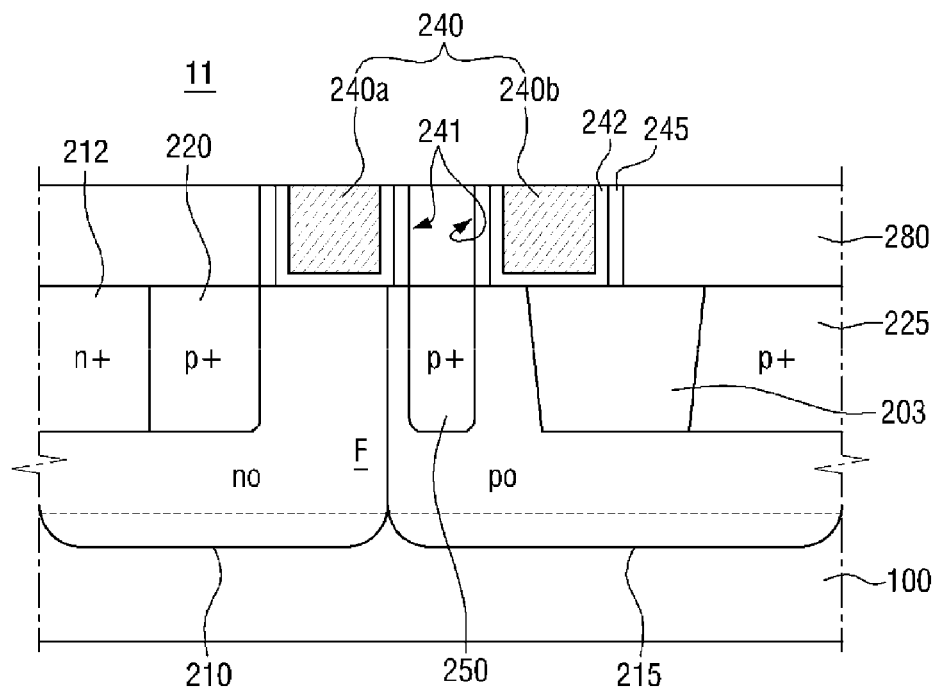

FIG. 16 is a view illustrating a semiconductor device according to example embodiments of the present inventive concepts.

For ease of description, the following description will focus on differences from the semiconductor device discussed above with reference to FIGS. 8 to 10.

Referring to FIG. 16, in a semiconductor device 11 according to example embodiments of the present inventive concepts, a height of a second isolation region 203 may be substantially equal to a height of a fin type active pattern F protruding above a top surface of a field insulation layer 105.

In FIG. 16, on the basis of a top surface of the fin type active pattern F, a depth of a second source region 220, a depth of a second drain region 225 and a depth of a second stud region 250 are equal to a depth of the second isolation region 203, which is illustrated only for ease of description, but example embodiments are not limited thereto.

Figure 17:
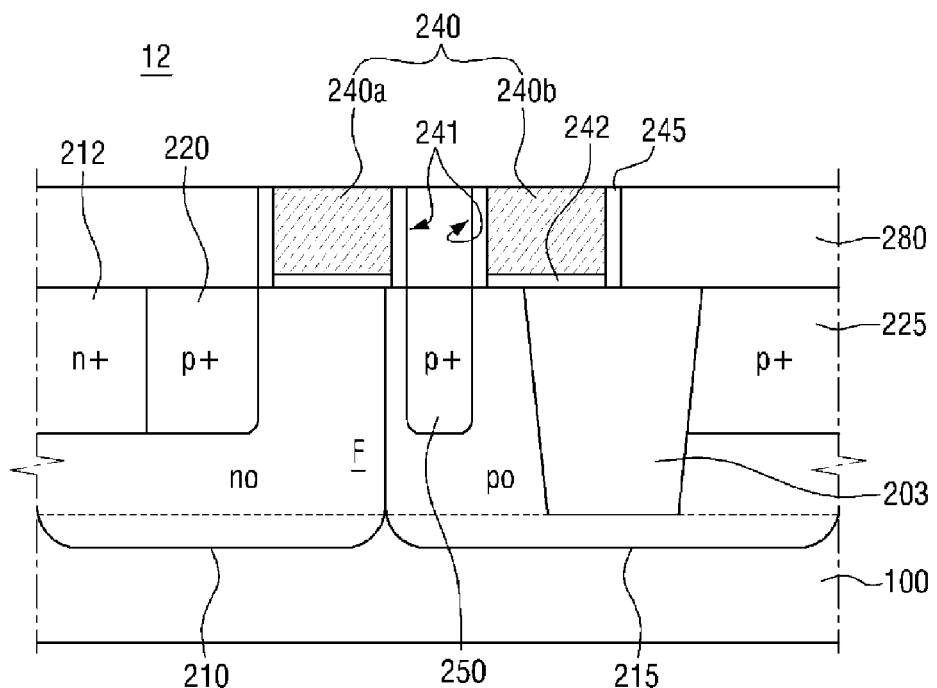

FIG. 17 is a view illustrating a semiconductor device according to example embodiments of the present inventive concepts.

For ease of description, the following description will focus on differences from the semiconductor device discussed above with reference to FIGS. 8 to 10.

Referring to FIG. 17, in a semiconductor device 12 according to example embodiments of the present inventive concepts, a second gate insulation layer 242 may not intervene between a second gate electrode 240 and a second gate spacer 245.

In addition, the second gate insulation layer 242 may not be formed along sidewalls of the second gate spacer 245.

Figure 18:
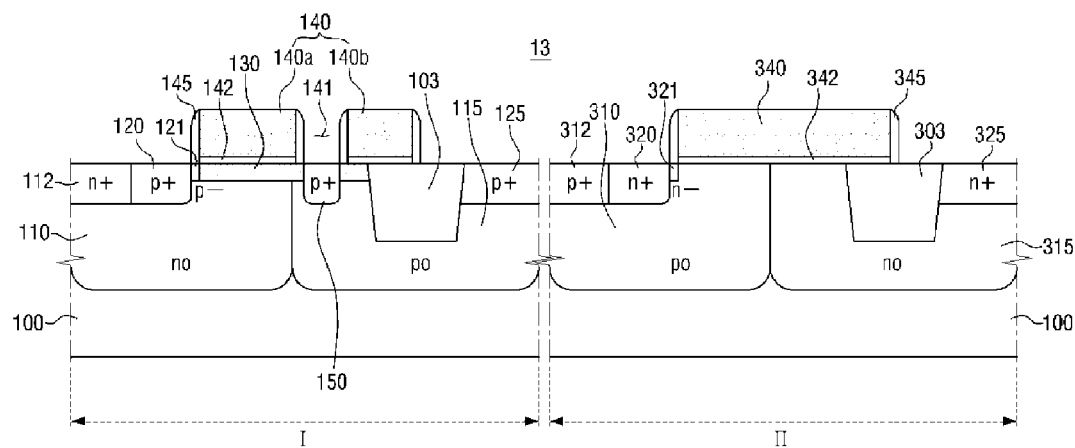

FIG. 18 is a view illustrating a semiconductor device according to example embodiments of the present inventive concepts.

For ease of description, the same content as in FIGS. 1 and 2 will be briefly described or will not be described.

Referring to FIG. 18, the semiconductor device 13 according to example embodiments of the present inventive concepts may include a first channel layer 130, a first gate electrode 140, a first source region 120, a first body region 110, a first drain region 125, a first drift region 115, a first isolation region 103, a first stud region 150, a third gate electrode 340, a third source region 320, a third body region 310, a third drain region 325, a third drift region 315 and a third isolation region 303.

A substrate 100 may include a first region I and a second region II. The first region I and the second region II may be regions spaced apart from each other or connected to each other.

In the following description, the invention will be described assuming that a device having a P-type source/drain region is formed in the first region I and a device having an N-type source/drain region is formed in the second region II. However, it is obvious to those of ordinary skill in the art that a device having an N-type source/drain region is formed in the first region I and a device having a P-type source/drain region is formed in the second region II.

The first channel layer 130, the first gate electrode 140, the first source region 120, the first body region 110, the first drain region 125, the first drift region 115, the first isolation region 103 and the first stud region 150 may be disposed in the first region I.

Because the first region I is substantially the same as described above with reference to FIGS. 1 and 2, a repeated description thereof will be given.

In addition, the third gate electrode 340, the third source region 320, the third body region 310, the third drain region 325, the third drift region 315 and the third isolation region 303 may be disposed in the second region II.

The third isolation region 303 may be formed in the substrate 100. The third isolation region 303 may be formed to isolate the third source region 320 and the third drain region 325 from each other. The third isolation region 303 may be formed to allow the third gate electrode 340 and the third drain region 325 to be spaced apart from and to be isolated from each other.

The third gate electrode 340 may be formed on the substrate 100. The third gate electrode 340 may not be separated, unlike the first gate electrode 140. That is to say, the third gate electrode 340 may not include an opening.

A portion of the third gate electrode 340 may overlap with the third isolation region 303. The third gate electrode 340 may function as a field plate. Accordingly, concentration of electric fields around the third isolation region 303 is reduced, thereby improving the reliability of the semiconductor device.

A semiconductor layer including a material having a different lattice constant from the substrate 100 may not intervene between the third gate electrode 340 and the substrate 100. That is to say, in the semiconductor device 13 according to example embodiments of the present inventive concepts, a channel region of a device formed in the first region I may be the first channel layer 130 having a different lattice constant from the substrate 100 and a channel region of a device formed in the second region II may be a portion of the substrate 100.

The third gate electrode 340 may include, for example, at least one of polycrystalline silicon (poly Si), amorphous silicon (a-Si), titanium (Ti), titanium nitride (TiN), tantalum nitride (TaN), titanium carbide (TiC), tantalum carbide (TaC), aluminum (Al) and tungsten (W). When the third gate electrode 340 includes silicon (Si), the third gate electrode 340 may include a metal silicide.

A third gate insulation layer 342 may be formed between the substrate 100 and the third gate electrode 340. The third gate insulation layer 342 may include silicon oxide, silicon oxynitride, silicon nitride and a high-k material having a higher dielectric constant than silicon nitride.

A third gate spacer 345 may be formed on sidewalls of the third gate electrode 340.

The third source region 320 may be formed at one side of the third gate electrode 340 and the third drain region 325 may be formed at the other side of the third gate electrode 340.

The third body region 310 may be formed at one side of the third gate electrode 340. In detail, the third body region 310 may be formed under the third source region 320 to surround the third source region 320.

The third body region 310 may have a lower doping concentration than the third source region 320 and the third drain region 325.

The third body contact region 312 being adjacent to the third source region 320 may be formed in the third body region 310. The third body contact region 312 may have a higher doping concentration than the third body region 310.

The third drift region 315 may be formed under the third drain region 325 to surround the third drain region 325. The third drift region 315 may overlap with the third isolation region 303.

That is to say, the third drift region 315 may be formed to surround the third isolation region 303 as well as the third drain region 325. The third isolation region 303 may be disposed in the third drift region 315.

The third drift region 315 may have a lower doping concentration than the third source region 320 and the third drain region 325.

In FIG. 18, the third drift region 315 and the third body region 310 making contact with each other are illustrated, which is provided only for ease of description, but example embodiments are not limited thereto.

Figure 19:
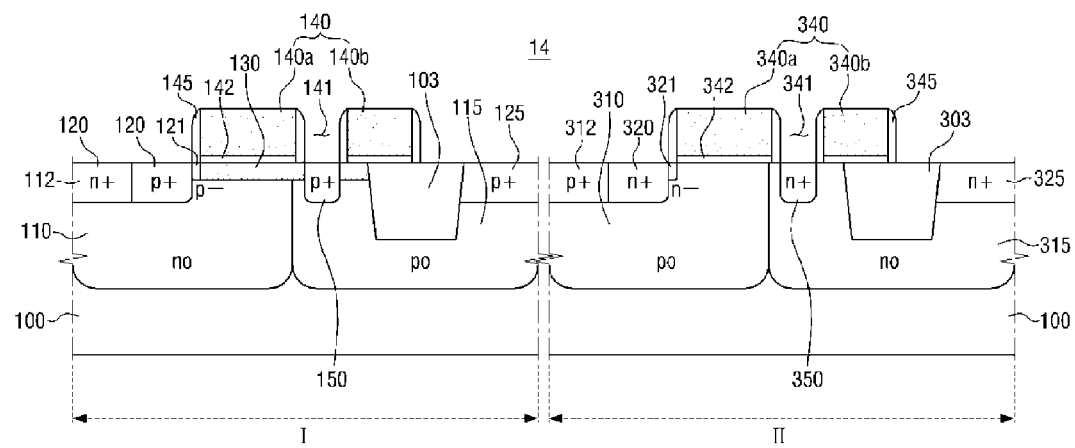

FIG. 19 is a view illustrating a semiconductor device according to example embodiments of the present inventive concepts.

For ease of description, the following description will focus on differences from the semiconductor device discussed above with reference to FIG. 18.

Referring to FIG. 19, a semiconductor device 14 according to example embodiments of the present inventive concepts may include a third stud region 350 disposed in a third drift region 315 and having a higher impurity concentration than the third drift region 315 and a third body region 310.

The third gate electrode 340 may include a fifth gate line 340a and a sixth gate line 340b electrically connected to the fifth gate line 340a.

The third gate electrode 340 may include a third opening 341 formed between the fifth gate line 340a and the sixth gate line 340b.

The fifth gate line 340a may not overlap with a third isolation region 303 and the sixth gate line 340b may overlap with the third isolation region 303. In more detail, a portion of the sixth gate line 340b may overlap with the third isolation region 303.

The third opening 341 may not overlap with the third body region 310 but may overlap with the third drift region 315.

The third stud region 350 may be disposed in the substrate 100 located to correspond to the third opening 341. That is to say, the third stud region 350 may be disposed in the substrate 100 between the fifth gate line 340a and the sixth gate line 340b.

The third stud region 350 may be spaced apart from the third isolation region 303 while not overlapping with the third isolation region 303. A depth of the third stud region 350 may be smaller than a depth of the third isolation region 303.

The third stud region 350 may be not electrically connected to a wire providing an electrical signal or power, so that the third stud region 350 may be electrically floating.

In FIG. 19, the third stud region 350 is an N-type high-concentration impurity region, like the third source region 320 and the third drain region 325, but example embodiments are not limited thereto.

Figure 20:
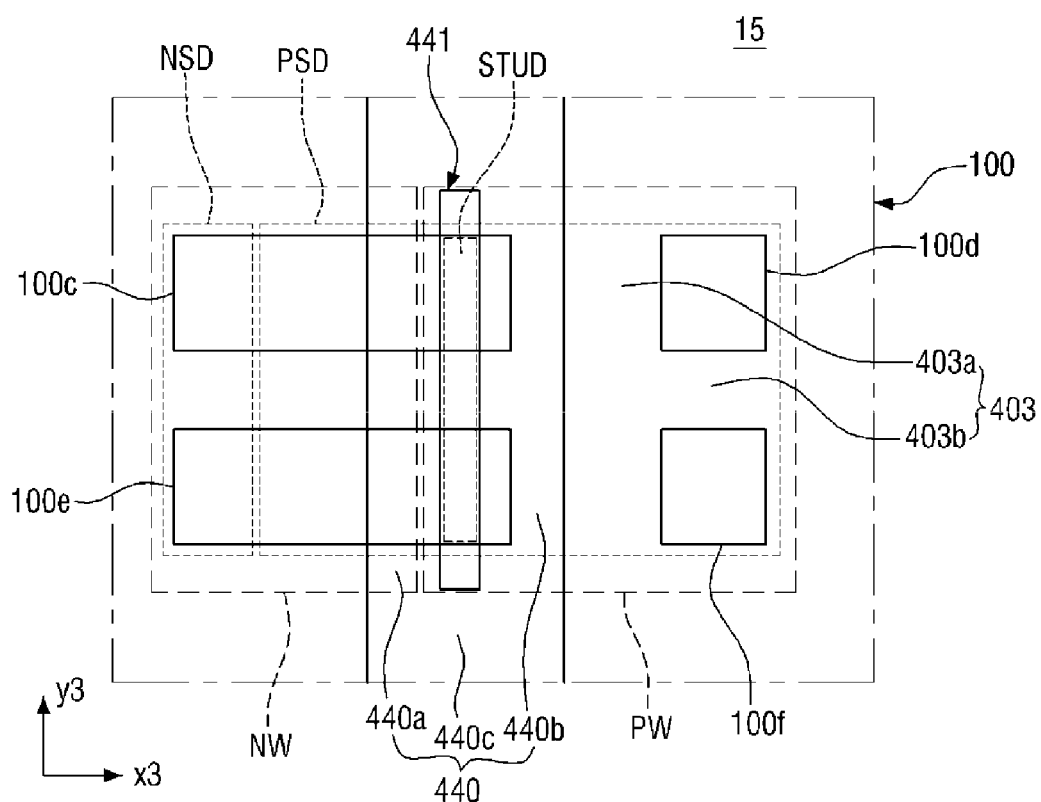

FIG. 20 is a conceptual plan view illustrating a semiconductor device according to example embodiments of the present inventive concepts.

Referring to FIG. 20, a semiconductor device 15 according to example embodiments of the present inventive concepts may include third to sixth active regions 100c, 100d, 100e and 100f and a fourth gate electrode 440.

A substrate 100 may include the third to sixth active regions 100c, 100d, 100e and 100f. The third to sixth active regions 100c, 100d, 100e and 100f may be separated by the fourth isolation region 403 formed in the substrate 100.

The fourth isolation region 403 may include a first part 403a extending lengthwise in a sixth direction Y3 and a second part 403b extending lengthwise in a seventh direction X3.

The third active region 100c and the fourth active region 100d may be separated from each other by the first part 403a of the fourth isolation region 403 and the fifth active region 100e and the sixth active region 100f may be separated from each other by the first part 403a of the fourth isolation region 403.

In addition, the third active region and the fifth active region 100e may be separated from each other by the second part 403b of the fourth isolation region 403 and the fourth active region and the sixth active region 100f may be separated from each other by the second part 403b of the fourth isolation region 403.

The third active region 100c and the fourth active region 100d, and the fifth active region 100e and the sixth active region 100f, may be arranged in the fifth direction X3. Alternatively, the third active region 100c and the fifth active region 100e, and the fourth active region 100d and the sixth active region 100f, may be arranged in the sixth direction Y3.

The fourth gate electrode 440 may include a seventh gate line 440a and an eighth gate line 440b extending in the sixth direction Y3. The seventh gate line 440a and the eighth gate line 440b may be arranged to be parallel with each other.

The fourth gate electrode 440 may include a plurality of second connection gates 440c connecting the seventh gate line 440a and the eighth gate line 440b. Because the second connection gates 440c connects the seventh gate line 440a and the eighth gate line 440b, the seventh gate line 440a and the eighth gate line 440b may be electrically connected. The second connection gates 440c may not overlap with the fourth isolation region 403.

The fourth gate electrode 440 may include a fourth opening 441 surrounded by the seventh gate line 440a, the eighth gate line 440b and the plurality of second connection gates 440c. The fourth opening 441 may be defined between the seventh gate line 440a and the eighth gate line 440b. The fourth gate electrode 440 may be shaped to continuously surround the outer circumference of the fourth opening 441.

The seventh gate line 440a may be formed to cross the third active region 100c and the fifth active region 100e.

The eighth gate line 440b may be formed to cross the third active region 100c and the fifth active region 100e. However, a portion of the eighth gate line 440b may overlap with the fourth isolation region 403.

A first P-type impurity region PSD is formed in the third to sixth active regions 100c, 100d, 100e and 100f, so that source regions may be formed in the third active region 100c and the fifth active region 100e and drain regions may be formed in the fourth active region 100d and the sixth active region 100f, respectively.

A first N-type impurity region NSD is formed in the third active region 100c and the fifth active region 100e, so that body contact regions may be formed in the third active region 100c and the fifth active region 100e, respectively.

A first N-type well region NW is formed in the third active region 100c and the fifth active region 100e, so that body regions may be formed in the third active region 100c and the fifth active region 100e, respectively.

A first P-type well region PW is formed in the third to the sixth active regions 100c, 100d, 100e and 100f and under the fourth isolation region 403, so that drift regions may be formed throughout the third active region 100c and the fourth active region 100d and throughout the fifth active region 100e and the sixth active region 100f.

Because a first stud part is formed in the third active region 100c and the fifth active region 100e exposed by the fourth opening 441, stud regions are formed in the third active region 100c and the fifth active region 100e, respectively.

The first stud part may be a portion of the first P-type impurity region PSD, but example embodiments are not limited thereto. When the first stud part is the portion of the first P-type impurity region PSD, the source regions, the drain region and the stud region may be formed in the same manufacturing process step.

Accordingly, a first element including impurity regions formed in the third active region 100c and the fourth active region 100d and the fourth gate electrode 440 may be formed, and a second element including impurity regions formed in the fifth active region 100e and the sixth active region 100f and the fourth gate electrode 440 may be formed.

That is to say, the first element and the second element may share the same fourth gate electrode 440 and may be devices having the same P-type source/drain region.

Figure 21:
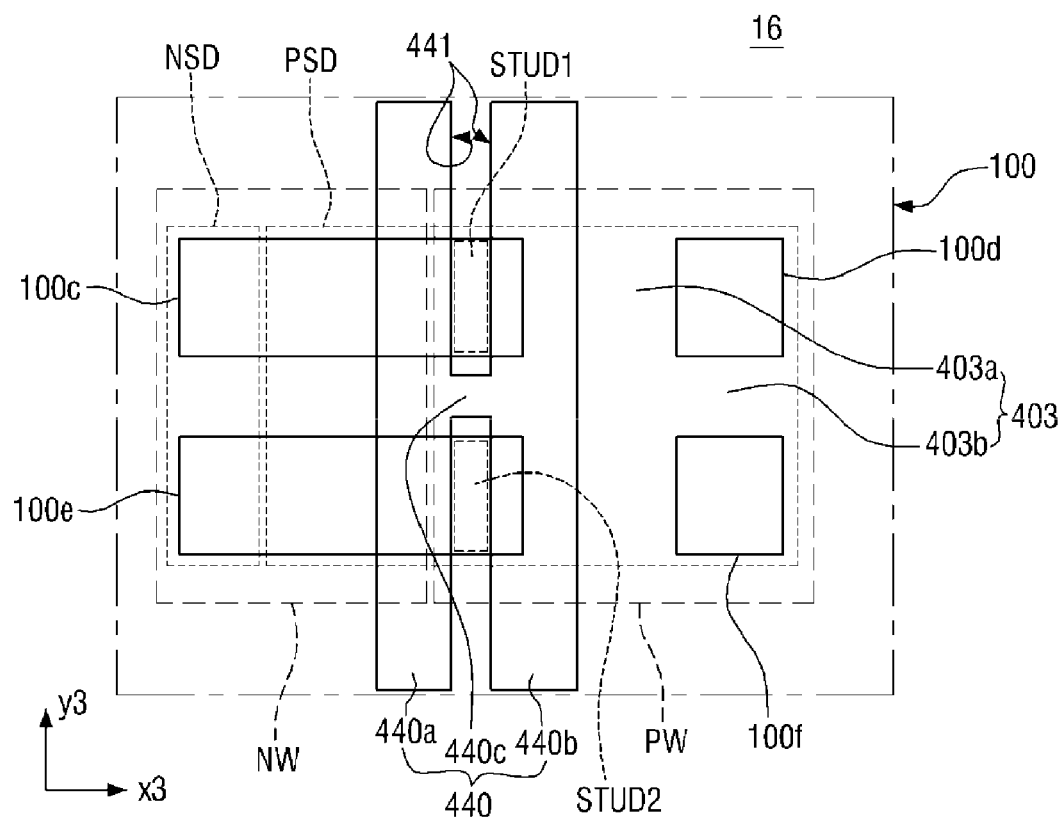

FIG. 21 is a conceptual plan view illustrating a semiconductor device according to example embodiments of the present inventive concepts.

For ease of description, the following description will focus on differences from the semiconductor device discussed above with reference to FIG. 20.

Referring to FIG. 21, in a semiconductor device 16 according to example embodiments of the present inventive concepts, a fourth gate electrode 440 includes a second connection gate 440c connecting a seventh gate line 440a and an eighth gate line 440b between a third active region 100c and a fifth active region 100e.

That is to say, the second connection gate 440c may overlap with a second part 403b of a fourth isolation region 403 between the third active region 100c and the fifth active region 100e.

Accordingly, a fourth opening 441 may be separated into a first part overlapping with the third active region 100c and a second part overlapping with the fifth active region 100e.

Figure 22:
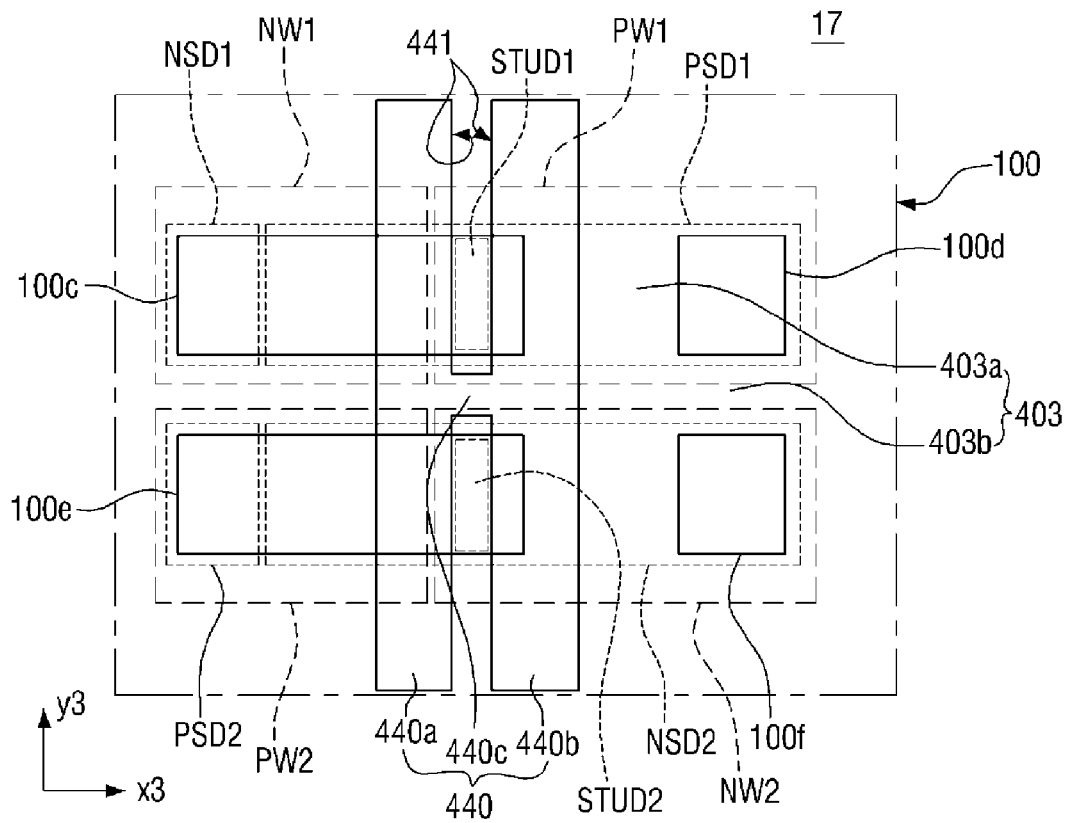

FIG. 22 is a conceptual plan view illustrating a semiconductor device according to example embodiments of the present inventive concepts.

For ease of description, the following description will focus on differences from the semiconductor device discussed above with reference to FIG. 21.

Referring to FIG. 22, in a semiconductor device 17 according to example embodiments of the present inventive concepts, a fourth gate electrode 440 may be shared by a first element having a P-type source/drain region and a second element having an N-type source/drain region.

That is to say, a first element including impurity regions formed in a third active region 100c and a fourth active region 100d and the fourth gate electrode 440 may be a device having a P-type source/drain region, and a second element including impurity regions formed in a fifth active region 100e and a sixth active region 100f and the fourth gate electrode 440 may be a device having an P-type source/drain region.

Hereinafter, semiconductor systems according to example embodiments of the present inventive concepts will be described with reference to FIGS. 23 to 26.

Figure 23:
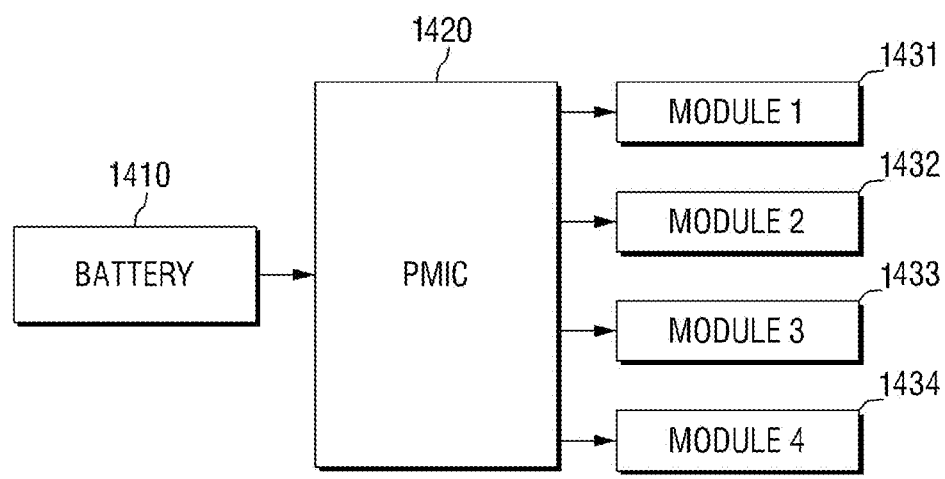

FIG. 23 is a block diagram illustrating a semiconductor system according to example embodiments of the present inventive concepts.

Referring to FIG. 23, the semiconductor system according to example embodiments of the present inventive concepts may include a battery 1410, power management IC (PMIC) 1420, and a plurality of modules 1431 to 1434. The PMIC 1420 receives a voltage from the battery 1410, shifts the received voltage to a desired voltage level for each of the modules 1431 to 1434, and provides the voltage at the desired voltage level to each of the modules 1431 to 1434. The PMIC 1420 may include at least one of the semiconductor devices according to the above-discussed example embodiments of the present inventive concepts.

Figure 24:
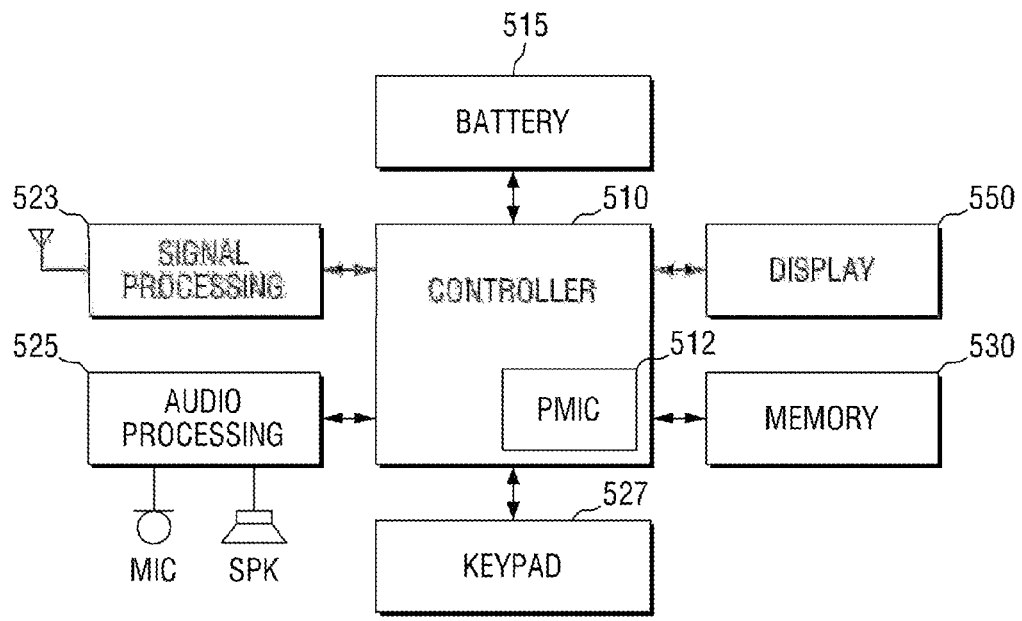

FIG. 24 is a block diagram illustrating a semiconductor system according to example embodiments of the present inventive concepts.

Referring to FIG. 24, a semiconductor system may be a portable terminal. The portable terminal may include a controller 510, a PMIC 512, a battery 515, a signal processing unit 523, an audio processing unit 525, a memory 530, and a display 550.

A keypad 527 includes keys for inputting numbers and text information and function keys for setting various functions.

The signal processing unit 523 performs a wireless communication function of the portable terminal and includes a radio frequency (RF) unit and a modem. The RF unit includes an RF transmitter which raises and amplifies the frequency of a transmitted signal and an RF receiver which low-noise amplifies a received signal and lowers the frequency of the received signal. The modem includes a transmitter which encodes and modulates a transmitted signal and a receiver which demodulates and decodes a received signal.

The audio processing unit 525 may include codec. The codec includes data codec and audio codec. The data codec processes packet data, and the audio codec processes audio signals such as sound and multimedia files. The audio processing unit 525 converts a digital audio signal received through the modem into an analog signal using the audio codec and reproduces the analog signal or converts an analog audio signal generated by a microphone into a digital audio signal using the audio code and transmits the digital audio signal to the modem. The code may be provided as a separate element or may be included in the controller 510 of the portable terminal.

The memory 530 includes a read-only memory (ROM) and a random access memory (RAM). The memory 530 may include a program memory and a data memory. The memory 530 may store programs for controlling the operation of the portable terminal and data necessary for booting the portable terminal.

The display 550 displays an image signal and user data on the screen or displays data related to calls. The display 550 may be a liquid crystal display (LCD) or an organic light-emitting diode (OLED). When the LCD or the OLED is implemented as a touch screen, the display 550 may operate as an input unit for controlling the portable terminal, together with the keypad 527.

The controller 510 controls the overall operation of the portable terminal. The controller 510 may include the PMIC 512. The PMIC 512 receives a voltage from the battery 515 and shifts the received voltage to a desired voltage level. The PMIC 512 may include at least one of the semiconductor devices according to the above-discussed example embodiments of the present inventive concepts.

Figure 25:
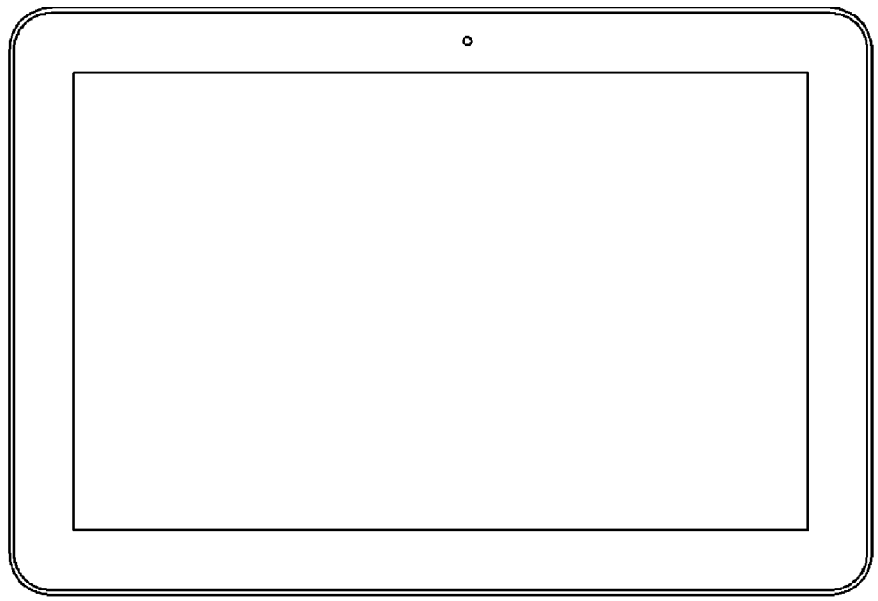
Figure 26:
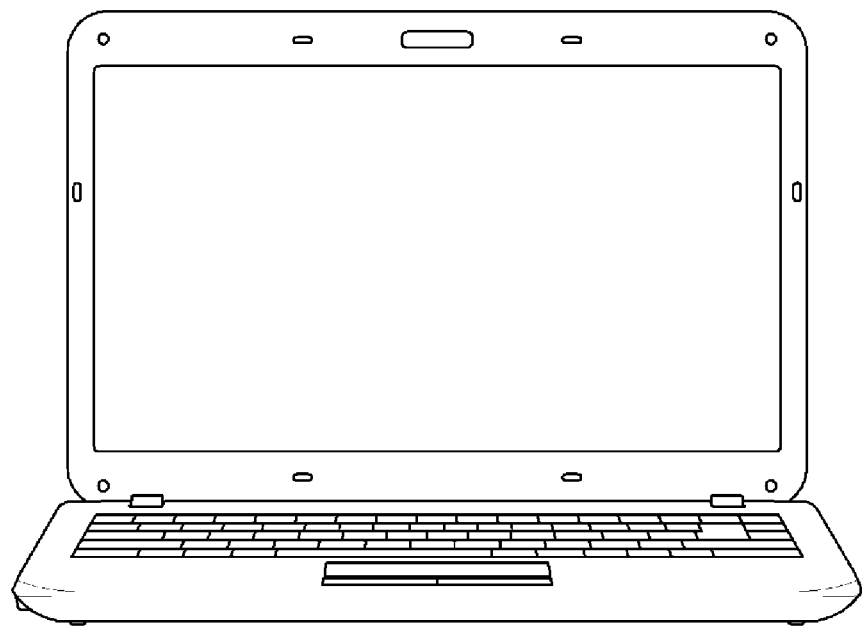

FIGS. 25 and 26 are views illustrating another semiconductor system to which semiconductor devices according to example embodiments of the present inventive concepts can be applied.

FIG. 25 illustrates an example in which a semiconductor device according to example embodiments of the present inventive concepts is applied to a tablet PC, and FIG. 26 illustrates an example in which a semiconductor device according to example embodiments of the present inventive concepts is applied to a notebook computer. At least one of the semiconductor devices according to some example embodiments of the present inventive concepts can be employed to a tablet PC, a notebook computer, and the like. It is obvious to one skilled in the art that the semiconductor devices according to example embodiments of the present inventive concepts may also be applied to other IC devices not illustrated herein.

Example embodiments provide semiconductor devices having a low threshold voltage and/or a reduced on-resistance $R_{on}$ while maintaining breakdown voltage characteristics. The semiconductor devices according to example embodiments include a SiGe channel layer that drops the threshold voltage and/or a high-concentration stud region to reduce the on-resistance $R_{on}$.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
a channel layer on a substrate, the channel layer including a material having a lattice constant different from a lattice constant of the substrate;
a first gate electrode on the channel layer;
a first source region of a first conductivity type at a first side of the first gate electrode; and
a first drain region of the first conductivity type at a second side of the first gate electrode,
wherein the substrate includes,
a first body region of a second conductivity type under the first source region, the first body region contacting a bottom surface and at least one sidewall of the first source region, and
a first drift region of the first conductivity type under the first drain region, the first drift region contacting a bottom surface and at least one sidewall of the first drain region, and
the semiconductor device further includes a first stud region in the channel layer and the first drift region, the first stud region having an impurity concentration higher than an impurity concentration of the first drift region.

2. The semiconductor device of claim 1, wherein a depth of the first stud region is smaller than a depth extending from a top surface of the channel layer to a bottom surface of the first drift region.

3. The semiconductor device of claim 1, wherein the first stud region and the first drain region are spaced apart from each other and do not overlap with each other.

4. The semiconductor device of claim 1, further comprising:
an isolation region in the first drift region,
wherein the isolation region overlaps with a portion of the first gate electrode.

5. The semiconductor device of claim 4, wherein a depth of the first stud region is smaller than a depth of the isolation region.

6. The semiconductor device of claim 1, wherein the first gate electrode includes an opening, and
the first stud region is in the channel layer and the first drift region so as to correspond to the opening.

7. The semiconductor device of claim 6, wherein the first gate electrode extends around a periphery of the opening.

8. The semiconductor device of claim 1, wherein the first gate electrode covers the first stud region.

9. The semiconductor device of claim 1, wherein the substrate further includes a first region and a second region,
the channel layer and the first gate electrode are in the first region, and
the semiconductor device further includes,
a second gate electrode in the second region on the substrate,
a second source region of the second conductivity type at a first side of the second gate electrode,
a second body region of the first conductivity type under the second source region, the second body region contacting a bottom surface and at least one sidewall of the second source region,
a second drain region of the second conductivity type at a second side of the second gate electrode, and
a second drift region of the second conductivity type under the second drain region, the second drift region contacting a bottom surface and at least one sidewall of the second drain region.

10. The semiconductor device of claim 9, further comprising:
a second stud region in the second drift region,
the second stud region having an impurity concentration higher than an impurity concentration of the second drift region.

11. The semiconductor device of claim 10, wherein the impurity concentration of the first stud region, an impurity concentration of the first source region and the impurity concentration of the first drain region, are substantially equal.

12. The semiconductor device of claim 1, wherein the first stud region is electrically floating.

13. The semiconductor device of claim 1, wherein the substrate includes silicon, and the channel layer includes silicon germanium.

14. The semiconductor device of claim 1, wherein the substrate includes at least one fin type active pattern, and
the first gate electrode extends across the at least one fin type active pattern.

15. A semiconductor device, comprising:
an isolation region in a substrate;
a first active region and a second active region in a first direction with the isolation region interposed therebetween;
a first gate line extending in a second direction different from the first direction, the first gate line extending across the first active region;
a second gate line electrically connected to the first gate line, the second gate line extending in the second direction so as to be parallel with the first gate line and across the first active region, and the second gate line having a portion overlapping with the isolation region;
a source region of a first conductivity type in the first active region at a first side of the first gate line;
a drain region of the first conductivity type in the second active region,
wherein the substrate includes,
a body region of a second conductivity type under the source region, the body region contacting a bottom surface and at least one sidewall of the source region, and
a drift region of the first conductivity type under the drain region, the drift region contacting a bottom surface and at least one sidewall of the drain region,
the drift region having a portion overlapping with the isolation region and the first active region, and
the semiconductor device further includes a stud region in the drift region of the first active region between the first gate line and the second gate line, the stud region having an impurity concentration than higher than an impurity concentration of the drift region.

16. The semiconductor device of claim 15, further comprising:
a gate connection line connecting one end of the first gate line and one end of the second gate line facing each other.

17. The semiconductor device of claim 15, further comprising:
a third active region and a fourth active region are arranged in the first direction with the isolation region interposed therebetween,
wherein the first active region and the third active region are arranged in the second direction,
the second active region and the fourth active region are arranged in the second direction, and the first gate line and the second gate line extend up to the third active region and the fourth active region, respectively.

18. A semiconductor device, comprising:
a substrate having a body region and a drift region, the substrate including, a source region within the body region, and a drain region within the drift region, wherein the source region, the drain region and the drift region have a conductivity type different than a conductivity type of the body region;
a stud region in the drift region and between the source and drain regions, the stud region having an impurity concentration higher than an impurity concentration in the drift region; and a gate electrode extending over portions of the drift region adjacent to a periphery of the stud region, wherein the semiconductor device further includes at least one of, a channel layer including a material having a lattice constant different than a lattice constant of the substrate; and
an isolation region in the drift region, the isolation region being between the drain region and the stud region.

19. The semiconductor device of claim 18, wherein the stud region is exposed through an opening in the gate electrode.

20. The semiconductor device of claim 18, wherein the impurity concentration of the stud region is substantially equal to,
an impurity concentration of the source region and an impurity concentration of the drain region, or
an impurity concentration of the body region.

* * * * *